United States Patent
Kato et al.

(10) Patent No.: US 9,627,087 B2
(45) Date of Patent: Apr. 18, 2017

(54) MEMORY DEVICE

(71) Applicant: KABUSHIKI KAISHA TOSHIBA, Minato-ku, Tokyo (JP)

(72) Inventors: Koji Kato, Yokohama Kanagawa (JP); Eietsu Takahashi, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/065,648

(22) Filed: Mar. 9, 2016

(65) Prior Publication Data

US 2017/0076813 A1  Mar. 16, 2017

Related U.S. Application Data

(60) Provisional application No. 62/217,629, filed on Sep. 11, 2015.

(51) Int. Cl.
| | | |
|---|---|---|
| *G11C 11/34* | (2006.01) | |
| *G11C 16/34* | (2006.01) | |
| *G11C 16/04* | (2006.01) | |
| *G11C 16/10* | (2006.01) | |

(52) U.S. Cl.
CPC ...... *G11C 16/3459* (2013.01); *G11C 16/0483* (2013.01); *G11C 16/10* (2013.01)

(58) Field of Classification Search
CPC . G11C 16/26; G11C 11/5628; G11C 11/5642; G11C 16/0483; G11C 16/10; G11C 16/12; G11C 16/24; G11C 16/32; G11C 16/3459; G11C 2211/5642
USPC ............ 365/185.18, 185.03, 185.19, 185.22, 365/185.24, 185.21, 185.23, 185.25, 365/185.28, 185.14, 185.17, 189.05, 365/189.15, 203
See application file for complete search history.

(56) References Cited

U.S. PATENT DOCUMENTS

| | | | |
|---|---|---|---|
| 2005/0213385 A1* | 9/2005 | Hosono | G11C 16/08 365/185.17 |
| 2009/0067247 A1 | 3/2009 | Park et al. | |
| 2009/0273978 A1 | 11/2009 | Fukuda | |
| 2010/0238733 A1 | 9/2010 | Fukuda et al. | |
| 2012/0275223 A1 | 11/2012 | Baek | |

FOREIGN PATENT DOCUMENTS

JP  2009266356 A  11/2009

\* cited by examiner

*Primary Examiner* — Thong Q Le
(74) *Attorney, Agent, or Firm* — Holtz, Holtz & Volek PC

(57) ABSTRACT

According to one embodiment, a memory device includes a string unit including a plurality of memory cell transistors which are connected in series, a first select transistor connected to a first end of the plurality of memory cell transistors, and a second select transistor connected to a second end of the plurality of memory cell transistors; and a bit line connected to the first select transistor.

20 Claims, 18 Drawing Sheets

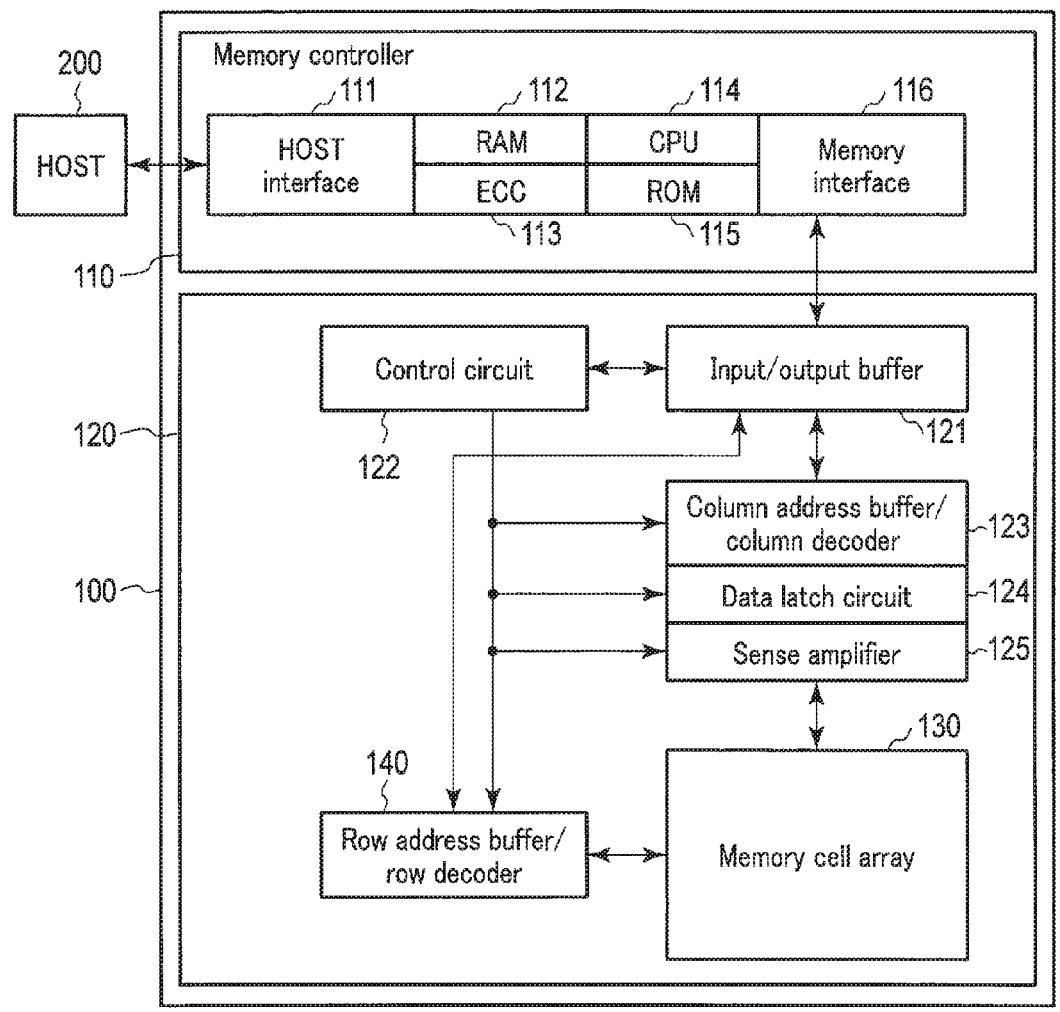
F I G. 1

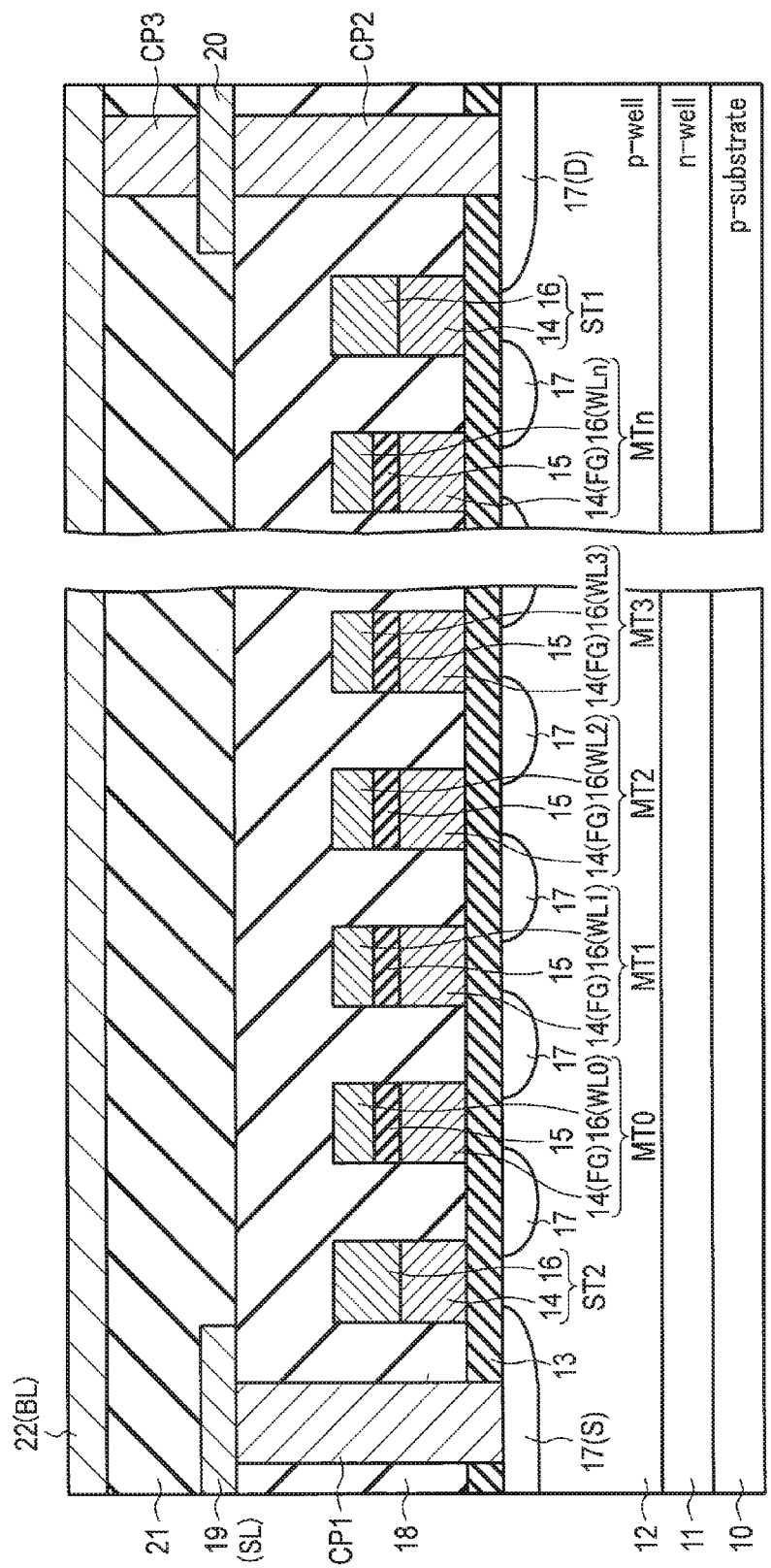
F I G. 4

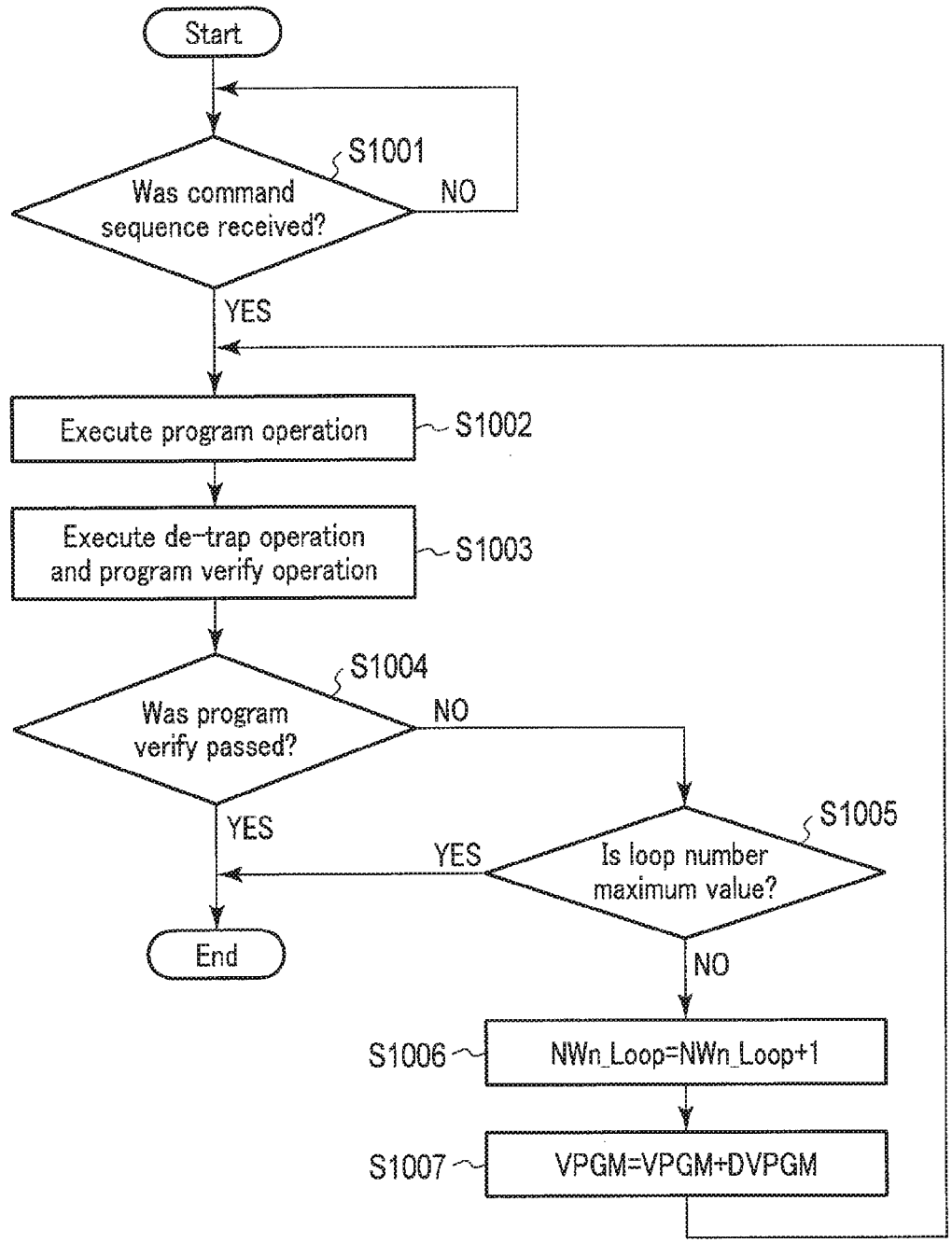
F I G. 5

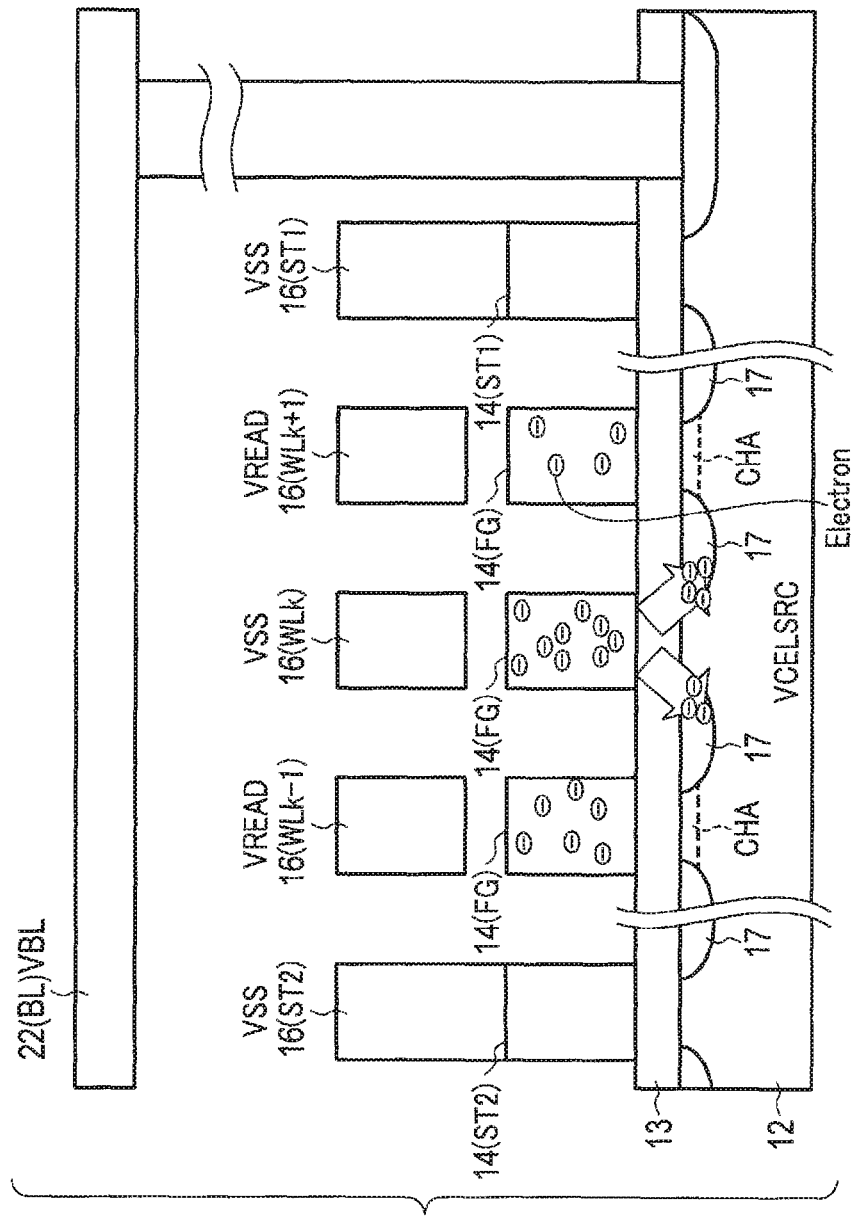
F I G. 9

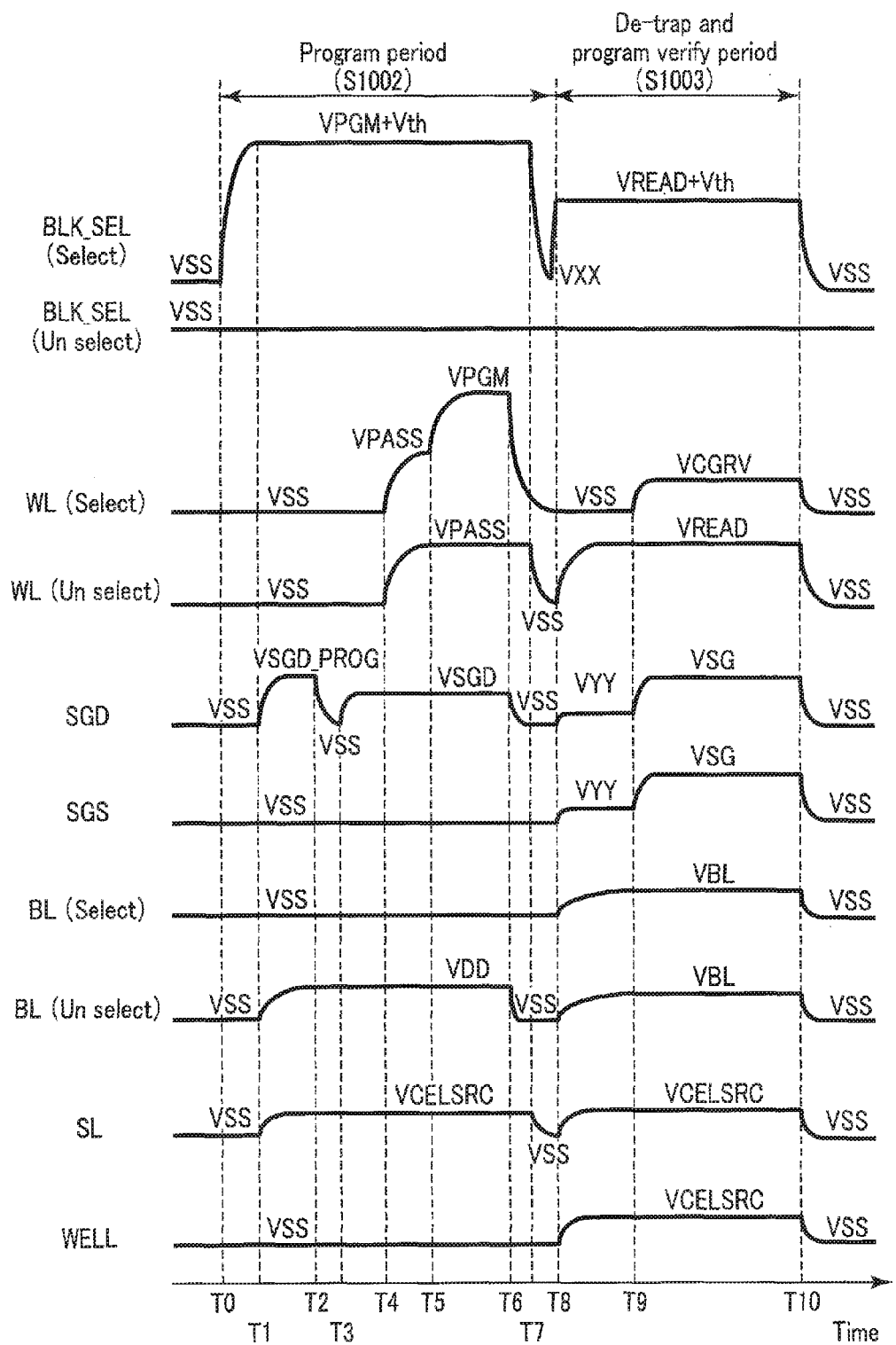
F I G. 10

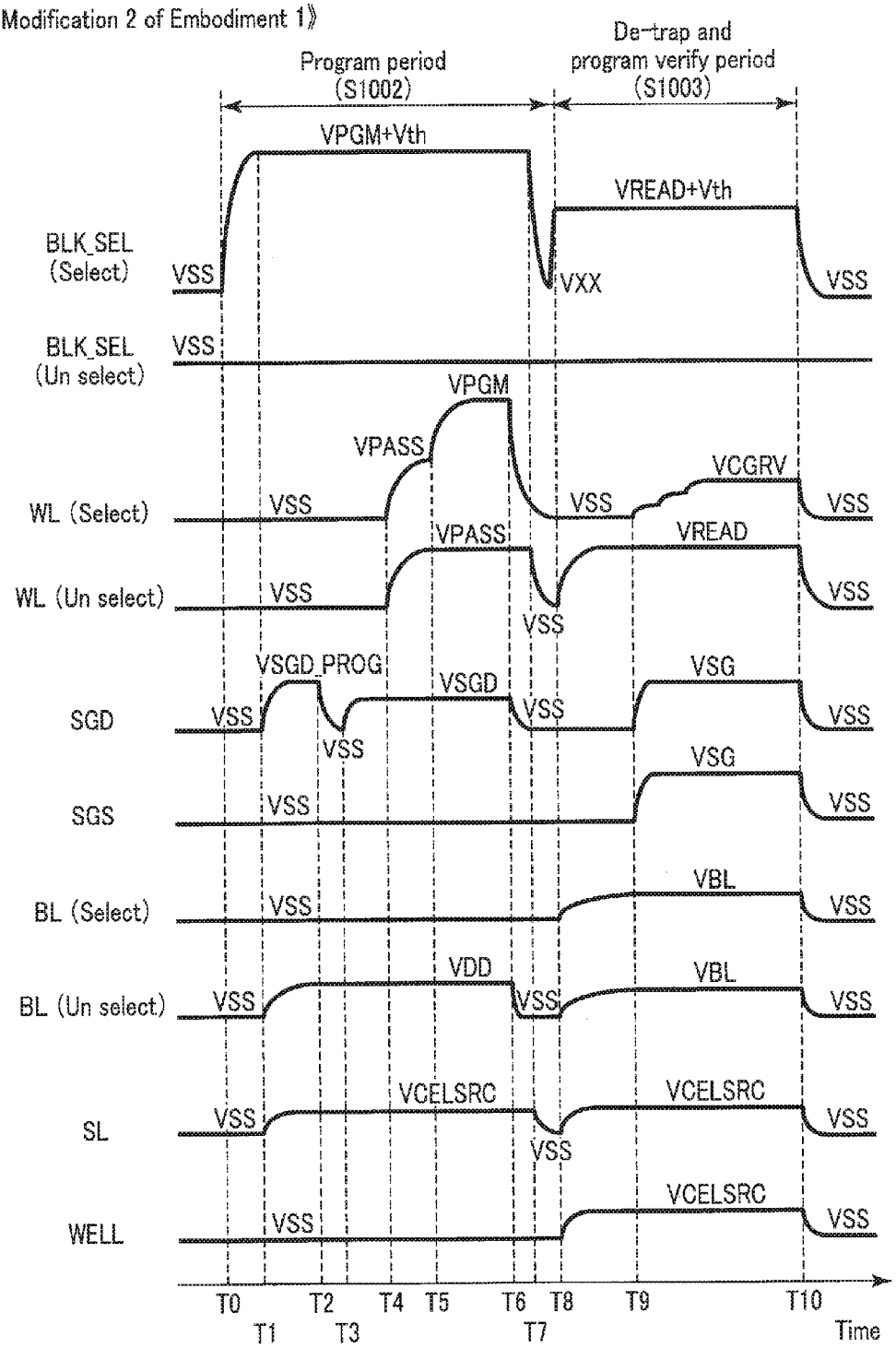
F I G. 11

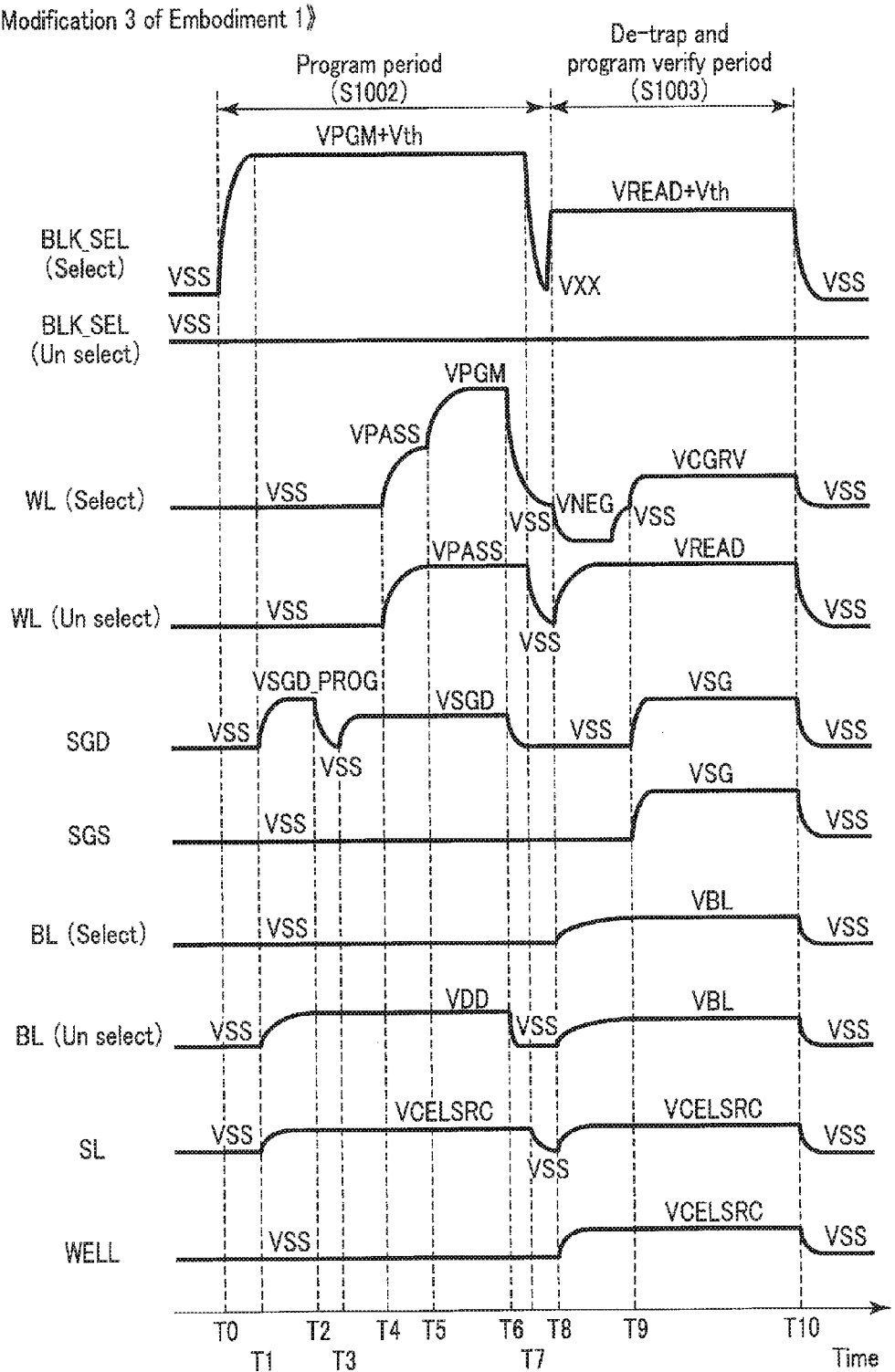
F I G. 12

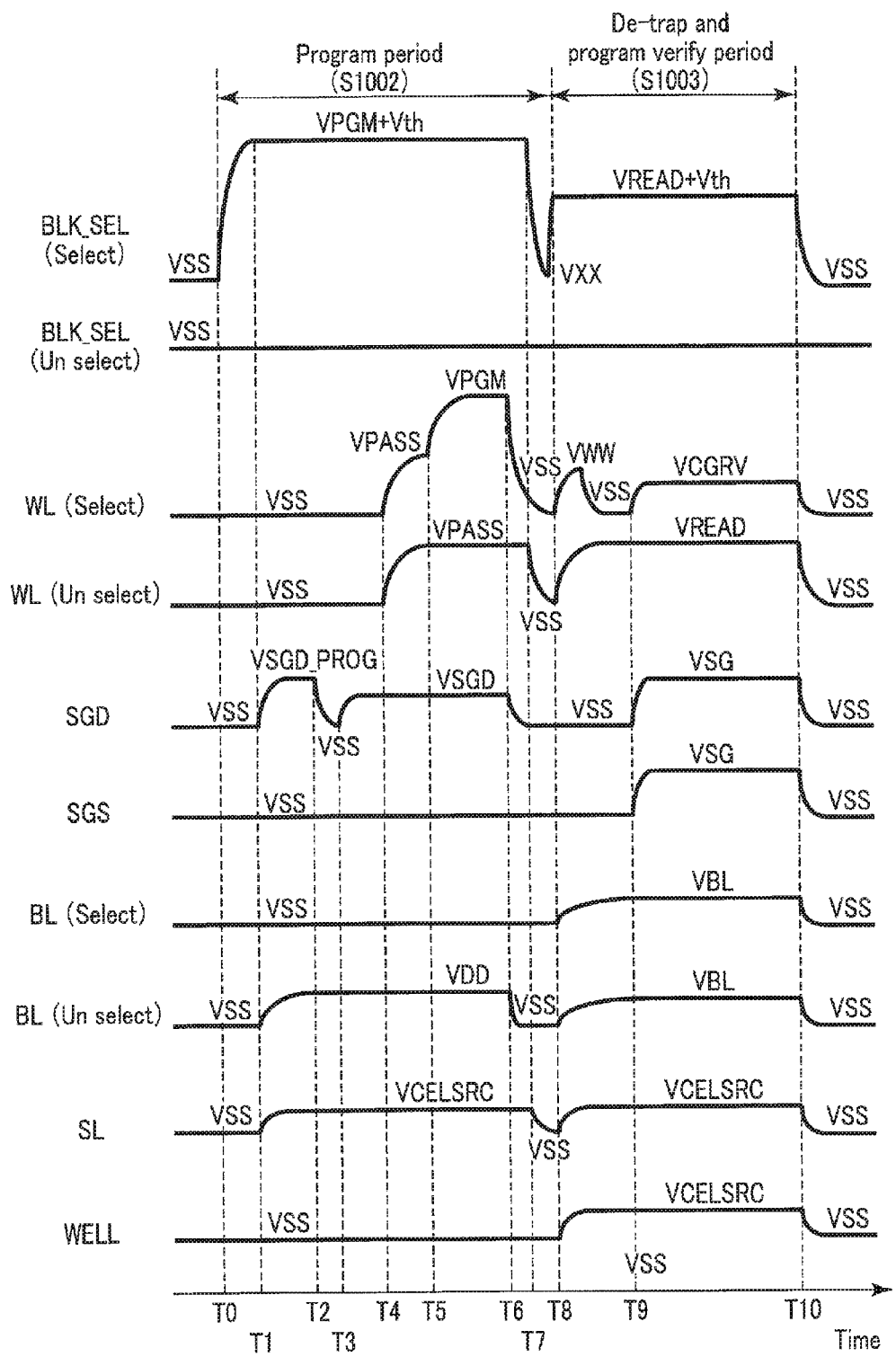
F I G. 13

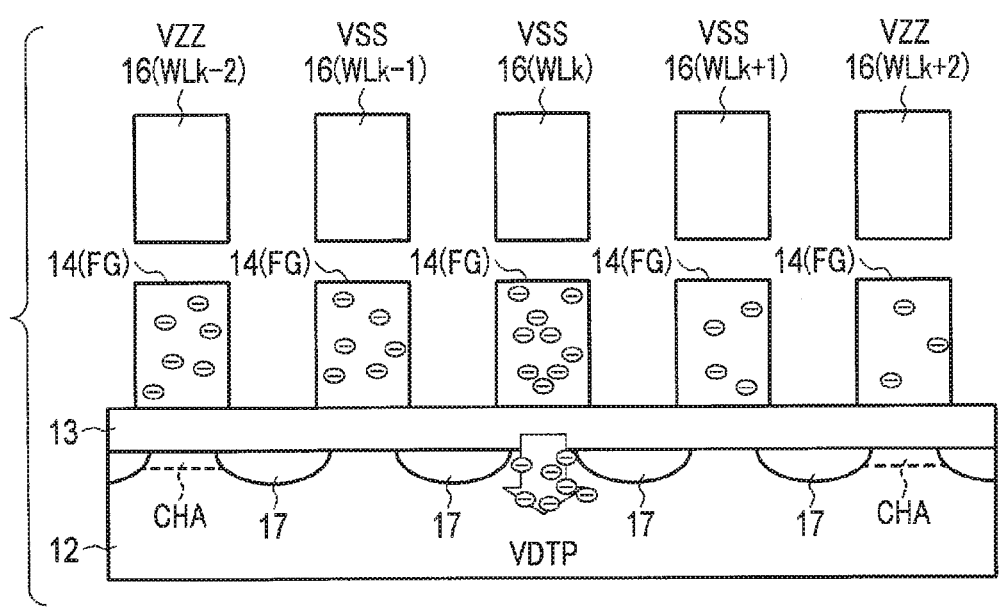
F I G. 17

MEMORY DEVICE

CROSS REFERENCE TO RELATED APPLICATIONS

This application claims the benefit of U.S. Provisional Application No. 62/217,629, filed Sep. 11, 2015, the entire contents of which are incorporated herein by reference.

FIELD

Embodiments relate to a memory device.

BACKGROUND

At present, with an increase in application use of nonvolatile semiconductor memory devices (memories), the operation speed has been increasing.

BRIEF DESCRIPTION OF THE DRAWINGS

FIG. 1 is a block diagram illustrating the outline of a memory system according to a first embodiment.

FIG. 4 is a cross-sectional view of the memory cell array of the memory system according to the first embodiment.

FIG. 5 is a flowchart illustrating a write operation of the memory system according to the first embodiment.

FIG. 9 is a cross-sectional view of the NAND string, illustrating a de-trap operation of the memory system according to the first embodiment.

FIG. 10 is a waveform diagram illustrating a write operation of a memory system according to Modification 1 of the first embodiment.

FIG. 11 is a waveform diagram illustrating a write operation of a memory system according to Modification 2 of the first embodiment.

FIG. 12 is a waveform diagram illustrating a write operation of a memory system according to Modification 3 of the first embodiment.

FIG. 13 is a waveform diagram illustrating a write operation of a memory system according to Modification 4 of the first embodiment.

FIG. 17 is a cross-sectional view of a NAND string, illustrating a de-trap operation of the memory system according to Modification 1 of the second embodiment.

DETAILED DESCRIPTION

Figure 2:
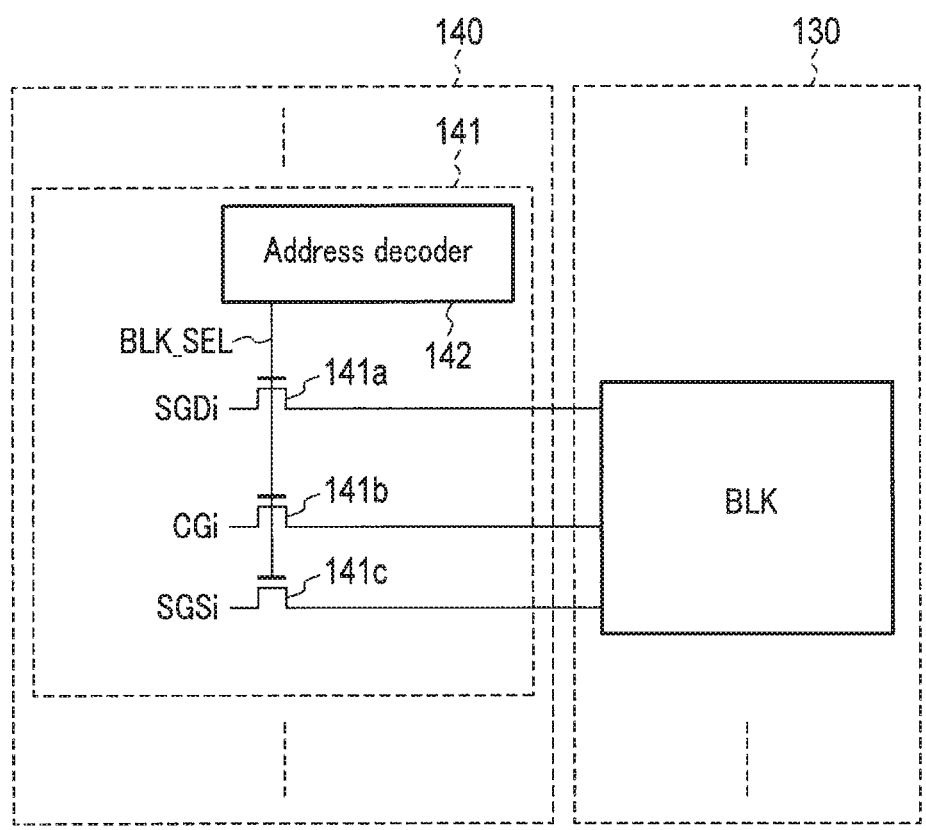
FIG. 2 is a circuit diagram illustrating the outline of a row decoder of the memory system according to the first embodiment.

In general, according to one embodiment, a memory device includes a string unit including a plurality of memory cell transistors which are connected in series, a first select transistor connected to a first end of the plurality of memory cell transistors, and a second select transistor connected to a second end of the plurality of memory cell transistors; and a bit line connected to the first select transistor, wherein the memory device is configured to execute program on a selected memory cell transistor of the string unit, and to verify a result of the program, and the memory device is configured to cause, at a time of the verify, while charging the bit line, a voltage of a control gate electrode of the selected memory cell transistor to transition to a low state, and to cause a voltage of a control gate electrode of an unselected memory cell transistor to transition from a low state to a high state, after setting the first select transistor and the second select transistor in an OFF state.

Hereinafter, embodiments will be described with reference to the accompanying drawings. In the description below, structural elements having substantially the same functions and structures are denoted by like reference signs. In addition, embodiments to be described below illustrate, by way of example, devices or methods for embodying technical concepts of the embodiments, and the technical concepts of the embodiments do not specifically restrict the material, shape, structure, arrangement, etc. of structural components to those described below. Various changes may be made in the technical concepts of the embodiments within the scope of the claims.

<1> First Embodiment

<1-1> Configuration

<1-1-1> Memory System

Referring to FIG. 1, a memory system 100 according to a first embodiment is described.

The memory system 100 of the first embodiment includes a memory controller 110 and a NAND flash memory (nonvolatile semiconductor memory device) 120. Incidentally, the memory system 100 may include a host device (also referred to simply as "host", etc.) 200.

<1-1-2> Memory Controller

The memory controller 110 includes a host interface ill, a RAM (Random Access Memory) 112, an ECC (Error Correcting Code) circuit 113, a CPU (Central Processing Unit) 114, a ROM (Read Only Memory) 115, and a flash memory interface 116.

The memory controller 110 outputs a command, etc., which are necessary for the operation of the NAND flash memory 120, to the NAND flash memory 120. By outputting the command to the NAND flash memory 120, the memory controller 110 executes data read from the NAND flash memory 120, data write to the NAND flash memory 120 (a write operation includes a plurality of loops, and one loop includes a program operation and a program verify operation), or data erase of the NAND flash memory 120.

The host interface 111 is connected to the host device 200, such as a personal computer, via a data bus. Data is transmitted/received between the host device 200 and memory system 100 via the host interface 111.

The RAM 112 is, for example, a volatile memory, and stores, for example, an operation program for the operation of the CPU 114.

When data was received from the host device 200, the ECC circuit 113 adds an error correcting code to the received data. Then, the ECC circuit 113 supplies the data with the added error correcting code to, for example, the flash memory interface 116. In addition, the ECC circuit 113 receives data, which was supplied from the NAND flash memory 120, via the flash memory interface 116. In addition, the ECC circuit 113 executes error correction on the data received from the NAND flash memory 120 by using the error correcting code. Further, the ECC circuit 113 supplies the data, on which the error correction was made, to the host interface 111.

The CPU 114 controls the operation of the entirety of the memory system 100. The CPU 114 controls the NAND flash memory 120, based on the data stored in the RAM 112 and ROM 115. Incidentally, also in the case in which the host device 200 is included in the memory system 100, as described above, the CPU 114 controls the operation of the entirety of the memory system 100.

The ROM 115 is a nonvolatile memory, and stores, for example, an operation program for the operation of the CPU 114.

The NAND flash memory 120 is connected to the flash memory interface 116 via a data bus.

<1-1-3> NAND Flash Memory

The NAND flash memory 120 includes an input/output buffer 121, a control circuit 122, a column address buffer/column decoder 123, a data latch circuit 124, a sense amplifier 125, a memory cell array 130, and a row address buffer/row decoder 140.

The memory cell array 130 is a region including a plurality of nonvolatile memory cell transistors. The detailed configuration of the memory cell array 130 will be described later.

The configuration of the memory cell array 130 is disclosed in U.S. patent application Ser. No. 12/397,711 filed Mar. 3, 2009 and entitled "SEMICONDUCTOR MEMORY DEVICE HAVING PLURALITY OF TYPES OF MEMORIES INTEGRATED ON ONE CHIP". In addition, the configuration thereof is disclosed in U.S. patent application Ser. No. 13/451,185 filed Apr. 19, 2012 and entitled "SEMICONDUCTOR MEMORY DEVICE INCLUDING STACKED GATE HAVING CHARGE ACCUMULATION LAYER AND CONTROL GATE AND METHOD OF WRITING DATA TO SEMICONDUCTOR MEMORY DEVICE", in U.S. patent application Ser. No. 12/405,626 filed Mar. 17, 2009 and entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT", and in U.S. patent application Ser. No. 09/956,986 filed Sep. 21, 2001 and entitled "NONVOLATILE SEMICONDUCTOR MEMORY DEVICE HAVING ELEMENT ISOLATING REGION OF TRENCH TYPE AND METHOD OF MANUFACTURING THE SAME". The entire descriptions of these patent applications are incorporated by reference herein.

At a time of a data read operation, the sense amplifier 125 senses data which was read to a bit line from a memory cell transistor. In addition, at a time of a data write operation, the sense amplifier 125 sets a voltage which corresponds to program data. The read and write of data from and to the memory cell array 130 are executed in units of a plurality of memory cell transistors (in units of a page to be described later). The sense amplifier 125 receives a bit line select signal which is input from the column address buffer/column decoder 123, and selects and drives any one of bit lines BL via a bit line select transistor (not shown).

In the meantime, the write operation includes a program voltage application operation (also referred to as "program operation", etc.) which injects a charge in a charge accumulation layer of a memory cell transistor MT and raises the threshold, and a program verify operation which confirms a variation of a threshold distribution as a result of this program voltage application operation.

The data latch circuit 124 includes a plurality of caches (not shown) which are composed of SRAMs, etc., respectively. Each of the caches stores data supplied from the memory controller 110, a verify result detected by the sense amplifier 125, etc. In addition, each of the caches holds data of one page. The definition of the page will be described later.

The column address buffer/column decoder 123 temporarily stores a column address signal which is input from the memory controller 110 via the input/output buffer 121. Then, the column address buffer/column decoder 123 outputs a select signal, which selects any one of the bit lines BL, to the sense amplifier 125 in accordance with the column address signal.

The row address buffer/row decoder 140 decodes a row address signal, and selects and drives a word line WL and a select gate line SGD, SGS of the memory cell array 130. In addition, the row address buffer/row decoder 140 includes a part which selects a block of the memory cell array 130 and a part which selects a page thereof.

Incidentally, the NAND flash memory 120 of the first embodiment includes an external input/output terminal I/O (not shown), and data transmission/reception is executed between the input/output buffer 121 and memory controller 110 via this external input/output terminal I/O. Address signals, which are input via the external input/output terminal I/O, are output to the column address buffer/column decoder 123 and row address buffer/row decoder 140.

The control circuit 122 executes sequence control of program and erase of data and executes control of a read operation, based on various external control signals supplied via the memory controller 110 (chip enable signal CEn, write enable signal WEn, read enable signal REn, command latch enable signal CLE, address latch enable signal ALE, etc.) and a command CMD. In addition, the control circuit 122 includes a voltage generation driver (not shown), and generates various voltages. Further, timings, etc. of transmitting various voltages to respective structures are controlled by a timer, etc. (not shown). Besides, the input/output buffer 121, control circuit 122, column address buffer/column decoder 123, data latch circuit 124, sense amplifier 125 and row address buffer/row decoder 140 may be called "control circuit" as a whole.

<1-1-4> Row Address Buffer/Row Decoder

Referring to FIG. 2, a description is given of the row address buffer/row decoder 140 of the memory system 100 according to the present embodiment. As illustrated in FIG. 2, the memory cell array 130 includes a plurality of blocks BLK. The row address buffer/row decoder 140 includes a driver 141 in association with each of the blocks BLK of the memory cell array 130.

In addition, the driver 141 includes an address decoder 142, and nMOS transistors 141a, 141b and 141c.

The address decoder 142 receives a control signal from the control circuit 122, and receives a block address from the row address buffer 140. Then, the address decoder 142 outputs a signal BLK_SEL, based on the control signal and block address.

Based on the signal BLK_SEL, the nMOS transistor 141a controls a connection between a select gate line SGD of a selected block BLK of the memory cell array 130 and a select gate line SGDi. To be more specific, when the voltage of the signal BLK_SEL is higher than a threshold voltage of the nMOS transistor 141a, the nMOS transistor 141a enters an ON state. As a result, the select gate line SGD of the selected block BLK of the memory cell array 130 is electrically connected to the select gate line SGDi. Here, "ON state" means that the source and drain of a transistor are electrically connected via the channel of the transistor. In addition, "OFF state" means that the source and drain of a transistor are not electrically connected. Even in the OFF state, there is a case in which a leak current or the like flows between the source and drain. This case is treated not as the ON state, but as the OFF state.

Based on the signal BLK_SEL, the nMOS transistor 141b controls a connection between a word line WL of a selected block BLK of the memory cell array 130 and a signal line WLi.

Based on the signal BLK_SEL, the nMOS transistor 141c controls a connection between a select gate line SGS of a selected block BLK of the memory cell array 130 and a select gate line SGSi.

In the meantime, the select gate lines SGDi, SGSi and signal line WLi are connected to the control circuit 122. In addition, "connected" means "directly connected" or "indirectly connected".

<1-1-5> Configuration of Memory Cell Array

Figure 3:
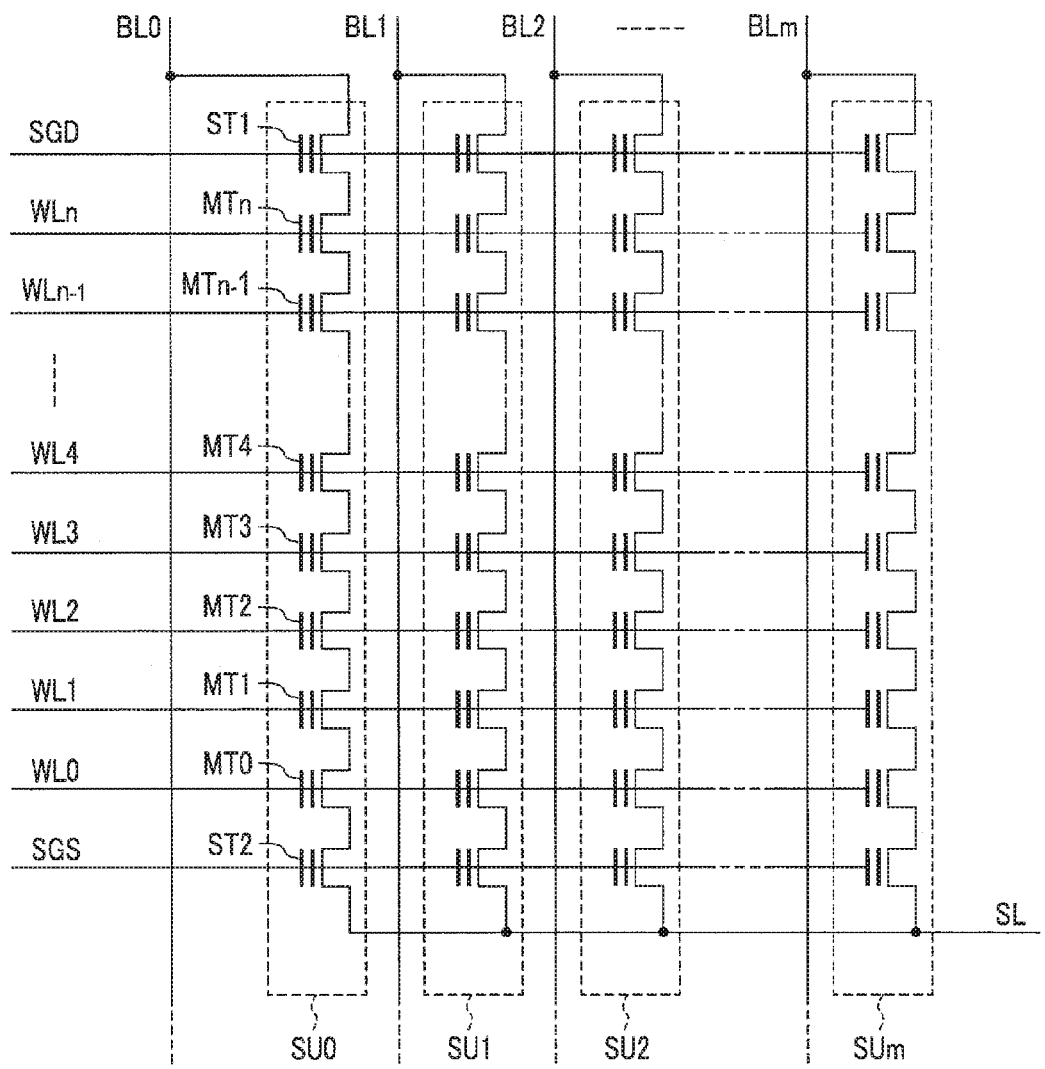
FIG. 3 is a circuit diagram illustrating a part of a memory cell array of the memory system according to the first embodiment.

Next, referring to FIG. 3, the details of the block BLK of the memory cell array 130 are described. FIG. 3 is a circuit diagram of the block BLK.

As illustrated in the Figure, the block BLK includes a plurality of NAND strings (also called "string units") SU (SU0 to SUm (m is a natural number)). Each of the NAND strings SU includes an n-number (n is a natural number) of memory cell transistors MT0 to MTn and select transistors ST1, ST2. Hereinafter, for the purpose of simple description, when the memory cell transistors MT0 to MTn are not distinguished, the memory transistors MT0 to MTn are referred to simply as "memory transistors MT" in some cases. The memory transistor MT includes a multilayer gate structure including a charge accumulation layer (e.g. floating gate) which is formed on a semiconductor substrate via a gate insulation film, and a control gate which is formed on the charge accumulation layer via an inter-gate insulation film. Neighboring ones of the memory cell transistors MT share a source and a drain. In addition, the memory cell transistors MT are disposed such that their current paths are connected in series between the select transistors ST1 and ST2. The drain on one end side of the series-connected memory cell transistors MT is connected to the source of the select transistor ST1, and the source on the other end side thereof is connected to the drain of the select transistor ST2. Specifically, the NAND string includes two select transistors ST1 and ST2, and a memory cell group including memory cell transistors MT which are connected in series between the select transistors ST1 and ST2.

The control gates of memory cell transistors MT, which are disposed on the same row, are commonly connected to any one of word lines WL0 to WLn, and the gates of select transistors ST1, ST2, which are disposed on the same row, are commonly connected to the select gate line SGD, SGS. In addition, the drains of select transistors ST1, which are disposed on the same column in the memory cell array 130, are commonly connected to any one of bit lines BL0 to BLm. The sources of the select transistors ST2 are commonly connected to a source line SL. Incidentally, both select transistors ST1, ST2 are not necessarily needed, and only one of them may be provided if a NAND cell can be selected.

In the memory cell array 130 with the above-described configuration, data is written batchwise to the plural memory cell transistors MT which are connected to the same word line WL. The unit of the write of data is called "page". In the present embodiment, for the purpose of simple description, a description is given of, by way of example, a case in which data is written batchwise to all of (m+1) memory cell transistors MT which are connected to the same word line. In addition, it is assumed that data read is also executed by the same unit as the data write. However, it is not always necessary that write and read be executed for all memory cell transistors MT at the same time, which are connected to the same word line. For example, there may be a case in which write and read are executed at the same time for memory cell transistors MT which are connected to even-numbered bit lines (BL0, BL2, BL4, . . . ), and for memory cell transistors MT which are connected to odd-numbered bit lines (BL1, BL3, BL5, . . . ), among the memory cell transistors MT connected to the same word line. For example, when data is written to the memory cell transistors MT connected to the even-numbered bit lines, odd-numbered bit lines are treated as unselected bit lines. The same applies to the opposite case.

<1-1-6> Cross Section of Memory Cell Array

Next, referring to FIG. 4, a cross-sectional configuration of the NAND string with the above-described configuration is described. FIG. 4 is a cross-sectional view along a bit line direction of the NAND string. As illustrated in the Figure, an n-type well region 11 is provided on a surface region of a p-type semiconductor substrate (e.g. silicon substrate) 10. A p-type well region 12 is provided on a surface region of the n-type well region 11. A gate insulation film 13 is provided on the p-type well region 12. Gate structures of memory cell transistors MT and select transistors ST1 and ST2 are provided on the gate insulation film 13. The gate structure of the select transistor ST1, ST2 includes a conductive layer 14 provided on the gate insulation film 13, and a conductive layer 16 provided on the conductive layer 14. The gate structure of the memory cell transistor MT includes a conductive layer 14 provided on the gate insulation film 13, an inter-gate insulation film 15 provided on the conductive layer 14, and a conductive layer 16 provided on the inter-gate insulation film 15. It should suffice if the conductive layer 14 functions as a memory layer (charge accumulation layer), and the conductive layer 14 may be a metal, polycrystalline silicon, or a charge trap-type material. It should suffice if the conductive layer 16 functions as a control gate electrode of a transistor, and the conductive layer 16 may be a metal, or polycrystalline silicon. The inter-gate insulation film 15 is formed of, for example, a silicon oxide film, or an ON film, an NO film or an ONO film which is a multilayer structure including a silicon oxide film and a silicon nitride film. Incidentally, for the purpose of simplicity, the well region is also described simply as "well". In addition, in some cases, the p-type semiconductor substrate 10, n-type well region 11 and p-type well region 12 are described simply as "semiconductor substrate".

In the memory cell transistor MT, the conductive layer 14 functions as a charge accumulation layer (FG: floating gate). On the other hand, the conductive layer 16 functions as a control gate electrode (word line WL). In the select transistor ST1, ST2, the conductive layer 14, 16 functions as the select gate line SGS, SGD. An n-type impurity diffusion layer 17 is formed in a surface of the p-type well region 12, which is located between the gate structures. The impurity diffusion layer 17 is shared by neighboring transistors, and functions as a source (S) or a drain (D).

An interlayer insulation layer 18 is formed on the p-type well region 12 in a manner to cover the gate structures of the memory cell transistors MT and select transistors ST1 and ST2. A contact plug CP1, which reaches the impurity diffusion layer (source) 17 of the source-side select transistor ST2, is formed in the interlayer insulation layer 18. In addition, a metal wiring layer 19, which is connected to the contact plug CP1, is formed on the interlayer insulation layer 18. The metal wiring layer 19 functions as the source line SL. Furthermore, a contact plug CP2, which reaches the impurity diffusion layer (drain) 17 of the drain-side select transistor ST1, is formed in the interlayer insulation layer 18. In addition, a metal wiring layer 20, which is connected to the contact plug CP2, is formed on the interlayer insulation layer 18.

An interlayer insulation layer 21 is formed on the interlayer insulation layer 18 in a manner to cover the metal wiring layers 19 and 20. In addition, a contact plug CP3, which reaches the metal wiring layer 20, is formed in the interlayer insulation layer 21. A metal wiring layer 22, which is commonly connected to a plurality of contact plugs CP3, is formed on the interlayer insulation layer 21. The metal wiring layer 22 functions as the bit line BL.

<1-2> Data Write Operation According to the First Embodiment

Next, referring to a flowchart of FIG. 5, a data write operation (an operation including a program operation and a program verify operation) of the semiconductor memory device according to the present embodiment is described. Incidentally, the process to be described below is mainly executed by the control of the control circuit 122.

[S1001]

The control circuit 122 determines whether a program command, a block address, a page address and a program start command have been received from the memory controller 110. Incidentally, hereinafter, for the purpose of simple description, the program command, address, data and program start command may comprehensively be referred to as "command sequence" in some cases.

[S1002]

If the control circuit 122 determines that the command sequence has been received (step S1001, YES), the control circuit 122 stores the data of the received page in a cache (not shown) of the NAND flash memory 120. This cache is composed of an SRAM or the like, and stores the data supplied from the memory controller 110, and the verify result detected by the sense amplifier 125. Then, the control circuit 122 starts a program operation.

Next, an operation at a time of a program operation is described.

Figure 6:
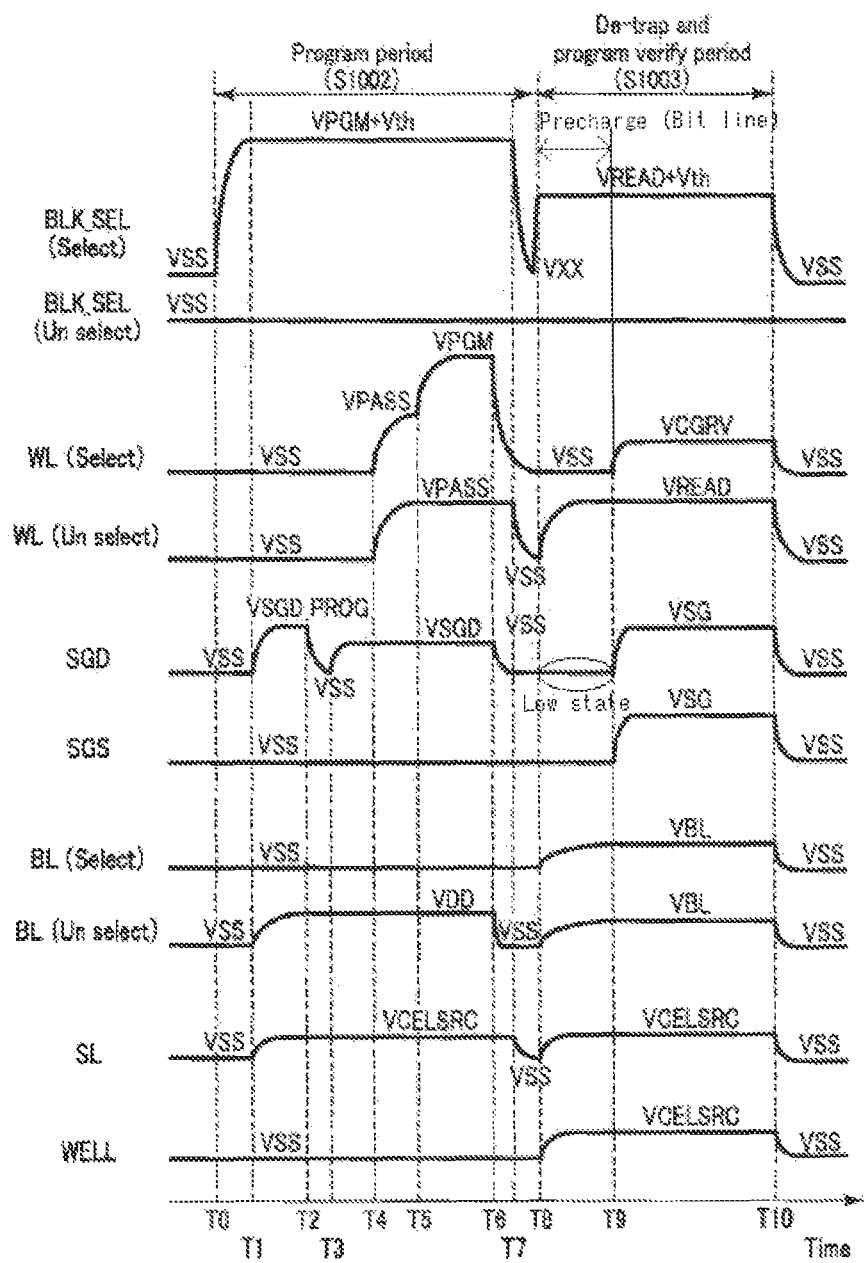
FIG. 6 is a waveform diagram illustrating the write operation of the memory system according to the first embodiment.

As illustrated in FIG. 6, at time instant T0 to time instant T1, based on a control signal from the control circuit 122, the address decoder 142 relating to the selected block BLK raises the voltage of the signal BLK_SEL from voltage "VSS" to voltage "VPGM+Vth" (VSS<VPGM+Vth). Incidentally, the voltage "Vth" is a threshold voltage at which the transistors 141a, 141b and 141c enter the ON state. In addition, the voltage "VSS" is, for example, 0 V. In the meantime, a voltage, which is higher than the voltage "VSS", may be described as "positive voltage", and a voltage, which is lower than the voltage "VSS", may be described as "negative voltage".

Thereby, the transistors 141a, 141b and 141c of the driver 141 relating to the selected block BLK enter the ON state. As a result, the select gate line SGD of the selected block BLK of the memory cell array 130 and the select gate line SGDi are connected. In addition, the word line WL of the selected block BLK of the memory cell array 130 and the signal line WLi are connected. Besides, the select gate line SGS of the selected block BLK of the memory cell array 130 and the select gate line SGSi are connected.

In addition, based on a control signal from the control circuit 122, the driver 141 relating to an unselected block BLK keeps the voltage of the signal BLK_SEL at voltage "VSS". Thereby, the transistors 141a, 141b and 141c of the driver 141 relating to the unselected block BLK enter the OFF state.

Furthermore, at time instant T0 to time instant T1, the control circuit 122 sets at voltage "VSS" the voltages of the selected word line WL, unselected word line WL, select gate line SGD, select gate line SGS, selected bit line BL, unselected bit line BL, source line SL and the well.

At time instant T1 to time instant T2, the control circuit 122 raises the voltage of a signal SGD from voltage "VSS" to voltage "VSGD_PROG" (VSS<VSGD_PROG<VPGM<VPGM+Vth). Thereby, a voltage is transferred from the bit line BL to an unselected NAND string. In addition, the voltage "VSGD_PROG" is about 4 to 5 V.

Besides, based on a signal from the control circuit 122, the sense amplifier 125 raises the voltage of the unselected bit line BL from voltage "VSS" to voltage "VDD" (VSS<VDD<VSGD_PROG<VPGM<VPGM+Vth). In addition, the control circuit 122 raises the voltage of the source line SL from "VSS" to voltage "VCELSRC" (VSS<VDD≂VCELSRC<VSGD_PRG<VPGM<VPGM+Vth). Thereby, charging of the selected bit line BL begins. There is a case in which the physical length of the bit line BL is greater than that of other wiring, and the time that is necessary for charging becomes longer in proportion to this.

At time instant T2 to time instant T3, the control circuit 122 lowers the voltage of the signal SGD from the voltage "VSGD_PRG" to voltage "VSS". Subsequently, at time instant T3 to time instant T4, the control circuit 122 sets the voltages of the signal SGD at voltage "VSGD" (VSS<VSGD<VDD ≂ VCELSRC<VSGD_PROG<VPGM<VPGM+Vth).

Thereby, each NAND string is electrically connected to the bit line BL and source line.

At time instant T4 to time instant T5, the control circuit 122 raises the voltages, which are applied to the selected word line WL and unselected word line WL, from voltage "VSS" to voltage "VPASS" (VSS<VSGD<VDD ≒VCELSRC<VSGD_PROG<VPASS<VPGM<VPGM+ Vth). The voltage "VPASS" is, for example, about 5 to 10 V.

At time instant T5 to time instant T6, the control circuit 122 raises the voltage, which is applied to the selected word line WL_SEL to "VPGM" (VSS<VSGD<VDD ≒VCELSRC<VSGD_PROG<VPASS<VPGM<VPGM+ Vth). The voltage "VPGM" is, for example, 10 to 25 V.

Figure 7:
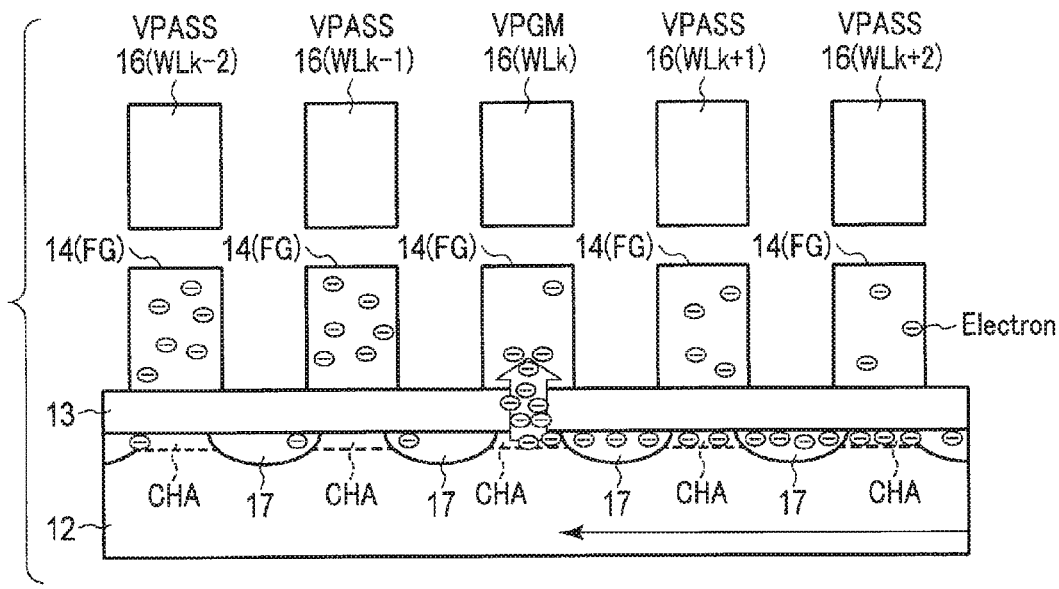
FIG. 7 is a cross-sectional view of a NAND string, illustrating a program operation of the memory system according to the first embodiment.

Referring to FIG. 7, a description is given of a selected memory cell transistor MT at a time of program. As illustrated in FIG. 7, channel regions CHA are formed in unselected memory cell transistors MT to which the voltage "VPASS" is applied, and in a selected memory cell transistor MT to which the voltage "VPGM" is applied. Since the selected bit line BL is at voltage "VSS", the voltage "VSS" is applied to the channel of the selected memory cell transistor MT. At this time, the program voltage "VPGM" is applied between the control gate electrode (conductive layer) 16 and the well 12. Thereby, a tunnel current by a high electric field occurs, and electrons are injected from the channel region CHA to the charge accumulation layer (conductive layer) 14 via the gate insulation film 13. In this manner, a program operation is executed on the selected memory cell transistor MT. Thus, the data stored in the cache (not shown) or the like is programmed to the memory cell array 130.

At time instant T6 to time instant T7 shown in FIG. 6, the control circuit 122 lowers the voltage, which is applied to the selected word line WL, from voltage "VPGM" to voltage "VSS". In addition, the control circuit 122 lowers the voltages of the signals SGD from "VSGD" to "VSS". Furthermore, based on a signal from the control circuit 122, the sense amplifier 125 lowers the voltage of the unselected bit line BL from voltage "VDD" to voltage "VSS".

At time instant T7 to time instant T8, based on a control signal from the control circuit 122, the address decoder 142 relating to the selected block BLK lowers the voltage of the signal BLK_SEL from the voltage "VPGM+Vth" to voltage "VXX (e.g. about 1 to 5 V)". Thereafter, based on a control signal from the control circuit 122, the address decoder 142 relating to the selected block BLK raises the voltage of the signal BLK_SEL from the voltage "VXX" to voltage "VREAD+Vth" (VSS<VSGD<VDD ≒VCELSRC<VSGD_PROG<VPASS ≒VREAD<VREAD+Vth<VPGM<VPGM+Vth). The control circuit 122 lowers the voltage, which is applied to the unselected word line WL, from the voltage "VPASS" to voltage "VSS". In addition, the control circuit 122 lowers the voltage of the source line SL from voltage "VCELSRC" to voltage "VSS". Thereby, the program operation (step S1002) is completed.

Figure 8:
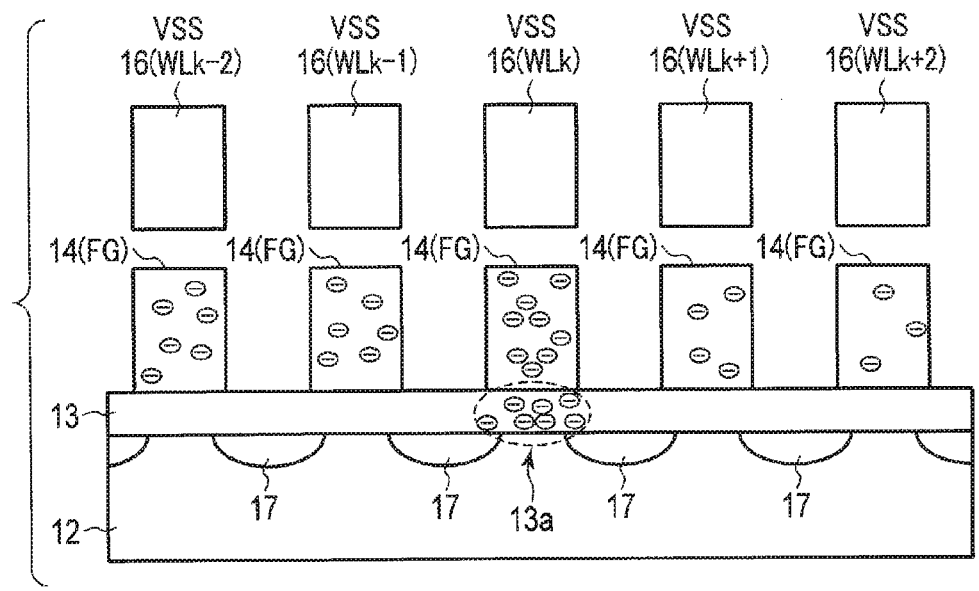
FIG. 8 is a cross-sectional view of the NAND string, illustrating a state after write of the memory system according to the first embodiment.

In the meantime, at a time point when the program operation is completed, as illustrated in FIG. 8, there is a case in which electrons 13a are trapped in the gate insulation film 13 of the selected memory cell transistor MT. The threshold of the memory cell transistor MT varies depending on the number of electrons which are held in the charge accumulation layer (conductive layer) 14. If program verify is executed in this state, the threshold is determined based on the electrons held in the charge accumulation layer (conductive layer) 14 and gate insulation film 13. However, the electrons 13a trapped in the gate insulation film 13 tend to be more easily de-trapped than the electrons held in the charge accumulation layer (conductive layer) 14. Such electrons 13a would move even with application of a weak voltage that is applied when the memory cell array 130 is operated. As a result, the threshold of the memory cell transistor MT would vary, leading to degradation in data reliability. Consequently, it is possible that the threshold of the memory cell transistor MT varies at a time of program verify and at a time of read. It is thus desirable to de-trap the electrons 13a at a time of program verify.

Referring back to FIG. 5, the subsequent process of the program operation will be described.

[S1003]

After the end of step S1002, the control circuit 122 executes a de-trap operation and a program verify operation. Here, a description is given of a method of simultaneously executing the de-trap operation and program verify operation.

As illustrated in FIG. 6, at time instant T8 to time instant T9, the control circuit 122 raises the voltage, which is applied to the unselected word line WL, from the voltage "VSS" to voltage "VREAD" (VSS<VSGD<VDD ≒VCELSRC<VSGD_PROG<VPASS ≒VREAD<VREAD+Vth<VPGM<VPGM+Vth). In addition, based on a signal from the control circuit 122, the sense amplifier 125 raises the voltages of the selected bit line and unselected bit line BL from the voltage "VSS" to voltage "VBL" (VSS<VSGD<VBL<VDD ≒VCELSRC<VSGD_PROG<VPASS ≒VREAD<VREAD+Vth<VPGM<VPGM+Vth). Further, the control circuit 122 raises the voltage of the source line SL from the voltage "VSS" to voltage "VCELSRC". In this manner, charging of the bit line BL begins. In addition, the control circuit 122 raises the voltage of the well 12 from the voltage "VSS" to voltage "VCELSRC".

In the meantime, at time instant T8 to time instant T9, the voltage "VSS" is applied to the selected word line WL, and signals SGD and SGS.

Since the bit line BL is a long wiring line, a time is needed for charging. Thus, in the present embodiment, a de-trap operation is executed while the bit line BL is being charged for program verify.

Referring to FIG. 9, a description is given of the selected memory cell transistor MT at a time of de-trap. At time instant T8 to time instant T9, the select transistors ST1 and ST2 and selected memory cell transistor MT are in the OFF state and the unselected memory cell transistor MT is in the ON state. Specifically, the selected NAND string is in a floating state. Thus, in the selected NAND string, with a predetermined voltage being applied to the unselected memory cell transistor MT, the potential of the surface of the well 12 is boosted by capacitive coupling. In addition, the voltage "VCELSRC" is applied to the well 12 so that the channel boost may not weaken. In the boost at this time, the voltages of the unselected word line WL and well 12 are controlled so as to become voltages of such a degree that the electrons held in the charge accumulation layer (conductive layer) 14 of the memory cell transistor MT may not be extracted.

Since the control gate of the selected memory cell transistor MT is at 0 V, the potential of the channel region CHA of the selected memory cell transistor MT is slightly lower than the potential of the vicinity thereof. However, the potential of the channel region CHA of the unselected transistor MT, which neighbors the selected memory cell transistor MT, is sufficiently boosted. Thereby, an electric field occurs between the gate insulation film 13 of the selected memory cell transistor MT and the well 12. This electric field is an electric field of an opposite polarity (opposite direction) to the electric field that is applied between the control gate electrode 16 and well 12 at a time of write. By this electric field, the electrons 13a in the gate insulation film 13 are released (de-trapped) to the well 12 (see arrows in the Figure).

Thereby, while the bit line BL is being charged for program verify, the number of electrons trapped in the gate insulation film 13 can be decreased.

If the charging of the bit line BL for the program verify is completed, the control circuit 122, at time instant T9 to time instant T10, raises the voltage, which is applied to the selected word line WL, from the "VSS" to voltage "VCGRV". The voltage "VCGRV" is a voltage for determining a threshold distribution of the memory cell transistor MT. The control circuit 122 raises the voltages of the signal SGD and signal SGS from the voltage "VSS" to voltage "VSG" (VSS<VSGD<VBL<VDD ≒ VCELSRC<VSGD_PROG ≒ VSG<VPASS ≒ VREAD<VREAD+Vth<VPGM<VPGM+Vth). Thereby, the select transistors ST1 and ST2 enter the ON state, and the channel boost at time instant T8 to time instant T9 is released. In the above manner, after the electrons trapped in the gate insulation film 13 are de-trapped, the threshold determination operation is executed. In addition, since the voltage "VCELSRC" is being applied to the well 12, the sense amplifier 125 can execute negative sense.

[S1004]

The control circuit 122 determines whether the program verify was passed. If the program verify in the selected page is passed (step S1004, YES), the write operation for this page is completed.

[S1005]

If the control circuit 122 determines that the program verify in the selected page is not passed (step S1004, NO), the control circuit 122 determines whether a loop number NWLn_loop of the program operation on this page has reached a maximum value or not. If the control circuit 122 determines that the loop number NWLn_loop has reached the maximum value (step S1005, YES), the control circuit 122 finishes the write operation on this page.

[S1006]

In step S1005, if the control circuit 122 determines that the loop number NWLn_loop has not reached the maximum value (step S1005, NO), the control circuit 122 updates the loop number NWLn_loop to NWLn_loop+1.

[S1007]

The control circuit 122 increases the program voltage VPGM by DVPGM. Then, using the updated program voltage VPGM, the control circuit 122 repeats the operation of step S1002.

The control circuit 122 repeats the operations of steps S1002 to S1007 until the control circuit 122 determines that the verify operation of step S1004 has been passed, or until the control circuit 122 determines in step S1005 that the loop number NWLn_loop is the maximum value.

<1-3> Advantageous Effects

According to the above-described embodiment, while the charging of the bit line for program verify is being performed, the channel boost is executed, and thereby the electrons trapped in the gate insulation film 13 of the selected memory cell transistor MT are de-trapped.

As described above, there is a case in which at the time of the program operation, electrons are trapped in the gate insulation film 13 of the selected memory cell transistor MT. In this case, it is possible that the electrons 13a become noise at the time of the verify operation. By de-trapping the electrons 13a before performing the program verify operation, a transition occurs to the state in which unstable electrons were eliminated at the time of the program verify operation. Specifically, since the program verify operation can be executed for stable electrons as a target, which are held in the charge accumulation layer (conductive layer) 14, the noise can be reduced.

As the method of de-trapping electrons which are trapped in the gate insulation film 13 of the selected memory cell transistor MT, such a method is thinkable that a de-trap operation is introduced as another sequence before the program verify operation. However, the time that is needed for de-trap is long, and, if this method is adopted, the time that is needed for the write operation would increase.

In the meantime, as described above, when the bit line BL is charged, there may be a case in which the charging time thereof becomes longer than the charging time of other wiring. Thus, in the present embodiment, while the bit line BL is being charged at the time of the program verify operation, the de-trap operation is executed at the same time. Thereby, the time that is needed for the de-trap operation can be hidden in the bit line charging time. It is thus possible to provide a high-speed, high-reliability semiconductor memory device.

Moreover, in the above-described embodiment, at time instant T8 to time instant T10, the voltage "VCELSRC" is applied to the well 12. Thus, the memory system 100 can execute negative sense while suppressing weakening of the channel boost. By executing the negative sense, it becomes possible to provide a margin to an interval between threshold distributions of memory cell transistors MT.

<1-4> Modifications of the First Embodiment

Hereinafter, modifications of the first embodiment are described. A description of the same parts as in the first embodiment is omitted.

<1-4-1> Modification 1 of the First Embodiment

Referring to FIG. 10, Modification 1 of the first embodiment is described.

At time instant T8 to time instant T9 in FIG. 6, the voltages of the select gate lines SGD and SGS are "VSS", but there is no limitation to this.

For example, as illustrated in FIG. 10, voltage "VYY (cutoff voltage)" (VSS<VYY), which can set the select transistors ST1 and ST2 in the OFF state, is applicable, aside from the voltage "VSS".

At time instant T8 to time instant T9, if the voltages of the select gate lines SGD and SGS are set at "VSS", hot carriers occur in the vicinity of the drains of the select transistors ST1 and ST2, and there may be a case in which the channel boot weakens. Thus, at time instant T8 to time instant T9, by setting the voltages of the select gate lines SGD and SGS at "VYY", it becomes possible to suppress generation of hot carriers in the vicinity of the drains of the select transistors ST1 and ST2.

Thereby, the electrons 13a can be de-trapped more exactly than in the first embodiment.

<1-4-2> Modification 2 of the First Embodiment

Referring to FIG. 11, Modification 2 of the first embodiment is described.

At time instant T9 to time instant T10 in FIG. 6, the control circuit 122 applies the voltage "VCGRV" to the selected word line WL, but there is no limitation to this.

For example, as illustrated in FIG. 11, when the memory cell transistor MT can hold 4-value data, the control circuit 122 applies the voltage "VCGRV" to the selected word line WL while stepping up the voltage "VCGRV". Thereby, 4-value data can be distinguished at the time of the program verify operation.

Here, the case has been described in which the memory cell transistor MT can hold 4-value data, but there is no limitation to this. In this case, it should suffice if the control circuit 122, at time instant T9 to time instant T10, applies the voltage "VCGRV" to the selected word line WL while stepping up the voltage "VCGRV" in accordance with the number of bits of the memory cell transistor MT.

Thereby, even where the memory cell transistor MT holds data of three values or more, the same advantageous effects as described in the first embodiment can be obtained.

Incidentally, Modification 2 of the first embodiment may be combined with Modification 1 of the first embodiment.

<1-4-3> Modification 3 of the First Embodiment

Referring to FIG. 12, Modification 3 of the first embodiment is described.

At time instant T8 to time instant T9 in FIG. 6, the control circuit 122 applies the "VSS" to the selected word line WL. However, as illustrated in FIG. 12, in the present modification, the control circuit 122 applies a negative voltage "VNEG" to the selected word line WL.

At time instant T8 to time instant T9, since the negative voltage "VNEG" is applied to the selected word line WL, a greater electric field occurs between the gate insulation film 13 of the selected memory cell transistor MT and the well 12. This electric field is an electric field of an opposite polarity (opposite direction) to the electric field that is applied between the control gate electrode 16 and well 12 at a time of write. If this electric field becomes greater than the electric field in the first embodiment, the electrons 13a in the gate insulation film 13 can more easily be released (de-trapped) to the well 12.

Thereby, the electrons 13a can be de-trapped more exactly than in the first embodiment.

Incidentally, Modification 3 of the first embodiment may be combined with Modification 1 of the first embodiment or Modification 2 of the first embodiment.

<1-4-4> Modification 4 of the First Embodiment

Referring to FIG. 13, Modification 4 of the first embodiment is described.

At time instant T8 to time instant T9 in FIG. 6, the control circuit 122 applies the "VSS" to the selected word line WL. In this case, it is possible that hot electrons occur in the semiconductor substrate on which the selected memory cell transistor MT is provided. Thus, in some case, holes occur, and the level of channel boost is weakened.

Thus, as illustrated in FIG. 13, in the present modification, a voltage "VWW" is applied for only a short period. Thereby, the occurrence of hot carriers can be suppressed. As a result, a decrease in level of the channel boost can be suppressed. Thereafter, the control circuit 122 applies the voltage "VSS" (or voltage "VNEG") to the selected word line WL. As described above, according to the present modification, the electrons 13a can be de-trapped more exactly than in the first embodiment.

Incidentally, Modification 4 of the first embodiment may be combined with Modification 1 of the first embodiment or Modification 2 of the first embodiment.

<2> Second Embodiment

Hereinafter, the second embodiment is described. A description of the same parts as in the first embodiment is omitted. In the second embodiment, a description is given of the case in which charge and discharge of each wiring line are suppressed between the program operation and program verify operation, thereby suppressing power consumption of the memory system 100.

<2-1> Data Write Operation Relating to the Second Embodiment

A description is given of a data write operation (an operation including a program operation and a program verify operation) of the semiconductor memory device according to the present embodiment. Incidentally, the process to be described below is mainly executed by the control of the control circuit 122. Hereinafter, of the operation illustrated in FIG. 5, steps S1002 and S1003, which are different in operation from the first embodiment, will be described. The other operation is the same as the operation described in the first embodiment.

[S1002]

Figure 14:
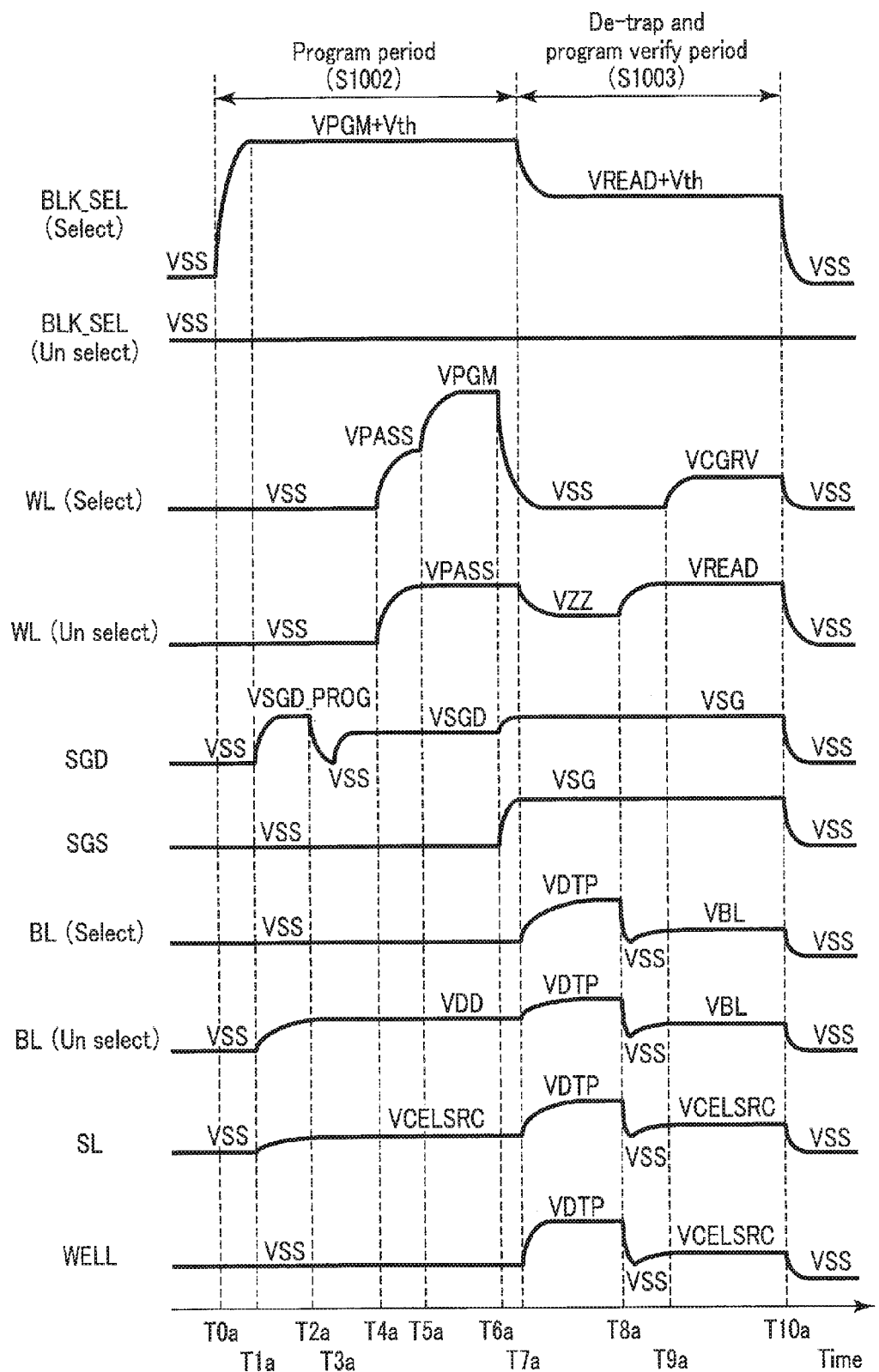
FIG. 14 is a waveform diagram illustrating a write operation of a memory system according to a second embodiment.

Referring to FIG. 14, an operation at a time of a program operation is described.

The operation at time instants T0a to T6a is the same as the operation at time instants T0 to T6 in FIG. 6.

At time instant T6a to time instant T7a, the control circuit 122 lowers the voltage, which is applied to the selected word line WL, from voltage "VPGM" to voltage "VSS". In addition, the control circuit 122 raises the voltages of the signals SGD and SGS to voltage "VSG". Thus, the program operation (step S1002) is completed.

[S1003]

After the end of step S1002, the control circuit 122 executes a de-trap operation and a program verify operation. Here, a description is given of a method of simultaneously executing the de-trap operation and program verify operation.

As illustrated in FIG. 14, at time instant T7a to time instant T8a, based on a control signal from the control circuit 122, the address decoder 142 relating to the selected block BLK lowers the voltage of the signal BLK_SEL from voltage "VPGM+Vth" to voltage "VREAD+Vth". In the first embodiment, after the voltage of the signal BLK_SEL was lowered from voltage "VPGM+Vth" to voltage "VSS", the voltage of the signal BLK_SEL is raised from the voltage "VSS" to "VREAD+Vth". In the present embodiment, since this operation is needless, the power consumption becomes smaller than in the first embodiment.

The control circuit 122 lowers the voltage, which is applied to the unselected word line WL, from voltage "VPASS" to voltage "VZZ". In addition, based on a signal from the control circuit 122, the sense amplifier 125 raises the voltage of the unselected bit line BL from the voltage "VDD" to "VDTP". Based on a signal from the control circuit 122, the sense amplifier 125 raises the voltage of the selected bit line BL from the voltage "VSS" to "VDTP". The control circuit 122 raises the voltage of the source line SL from the voltage "VCELSRC" to "VDTP". The control circuit 122 raises the voltage of the well WELL from the voltage "VSS" to "VDTP".

In the meantime, the voltage "VZZ" is a voltage that is lower than the voltage "VPASS" by several V. In addition, the voltage "VDTP" is, for example, about 4 V.

The time instant T7a to time instant T8a are a discharge time from the voltage "VPASS" to voltage "VZZ" for executing a logic process such as a sense amplifier data control preparation for program verify, and for applying voltage "VREAD" to the unselected word line WL without a lift. Thus, in the present embodiment, a de-trap operation is executed during the preparation period for program verify.

Figure 15:
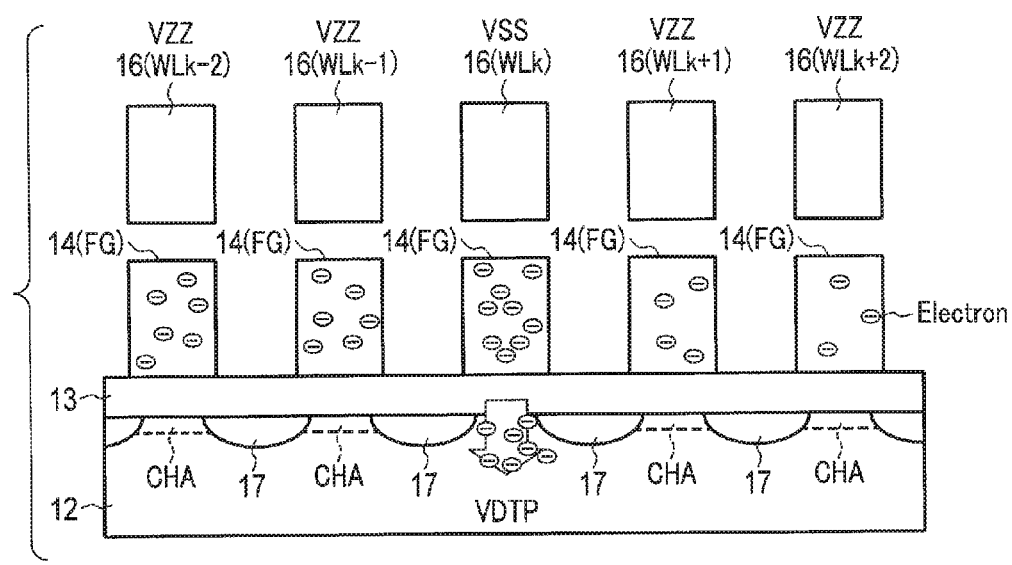
FIG. 15 is a cross-sectional view of a NAND string, illustrating a de-trap operation of the memory system according to the second embodiment.

Referring to FIG. 15, the selected memory cell transistor MT at the time of de-trap is described. At time instant T7a to time instant T8a, the selected memory cell transistor MT is in the OFF state, and the select transistors ST1 and ST2 and unselected memory cell transistor MT are in the ON state. In addition, voltage "VDTP" is applied to the well 12.

Thereby, an electric field occurs between the gate insulation film 13 of the selected memory cell transistor MT and the well 12. This electric field is an electric field of an opposite polarity (opposite direction) to the electric field that is applied between the control gate electrode 16 and well 12 at a time of write. By this electric field, the electrons 13a in the gate insulation film 13 are released (de-trapped) to the well 12 (see arrows in the Figure).

Thereby, during the preparation period for program verify, the number of electrons trapped in the gate insulation film 13 can be decreased.

If the preparation for the program verify is completed, the control circuit 122, at time instant T8a to time instant T9a, raises the voltage, which is applied to the unselected word line WL, from the "VZZ" to voltage "VREAD".

In addition, based on a signal from the control circuit 122, the sense amplifier 125 lowers the voltages of the selected bit line BL and unselected bit line BL from the voltage "VDTP" to voltage "VSS", and then raises these voltages from the "VSS" to voltage "VBL". The control circuit 122 changes the voltages of the source line SL and well WELL from the voltage "VDTP" to voltage "VCELSRC".

Incidentally, in the present embodiment, the voltage "VBL" is, for example, about 1.3 V, and the voltage "VCELSRC" is about 1 V.

If the charging of the bit line BL is completed, the control circuit 122, at time instant T9a to time instant T10a, raises the voltage, which is applied to the selected word line WL, from the "VSS" to voltage "VCGRV". In the above manner, after the electrons trapped in the gate insulation film 13 are de-trapped, the threshold determination operation is executed.

<2-2> Advantageous Effects

According to the above-described embodiment, during the preparation for program verify, the voltage for de-trap is applied to the well. Thereby, the electrons trapped in the gate insulation film 13 of the selected memory cell transistor MT are de-trapped.

In the present embodiment, during the preparation period for program verify, the de-trap operation is executed at the time. Thereby, the time that is needed for the de-trap operation can be hidden in the preparation period for program verify. It is thus possible to provide a high-speed, high-reliability semiconductor memory device.

In the meantime, the second embodiment may be combined with the operation described in Modification 2 of the first embodiment. Specifically, at time instant T9a to time instant T10a, the control circuit 122 may apply voltage "VCGRV" to the selected word line WL while stepping up the voltage "VCGRV". Thereby, multi-value data can be distinguished at the time of the program verify operation.

<2-3> Modifications of the Second Embodiment

Hereinafter, modifications of the second embodiment are described. A description of the same parts as in the second embodiment is omitted.

<2-3-1> Modification 1 of the Second Embodiment

Figure 16:
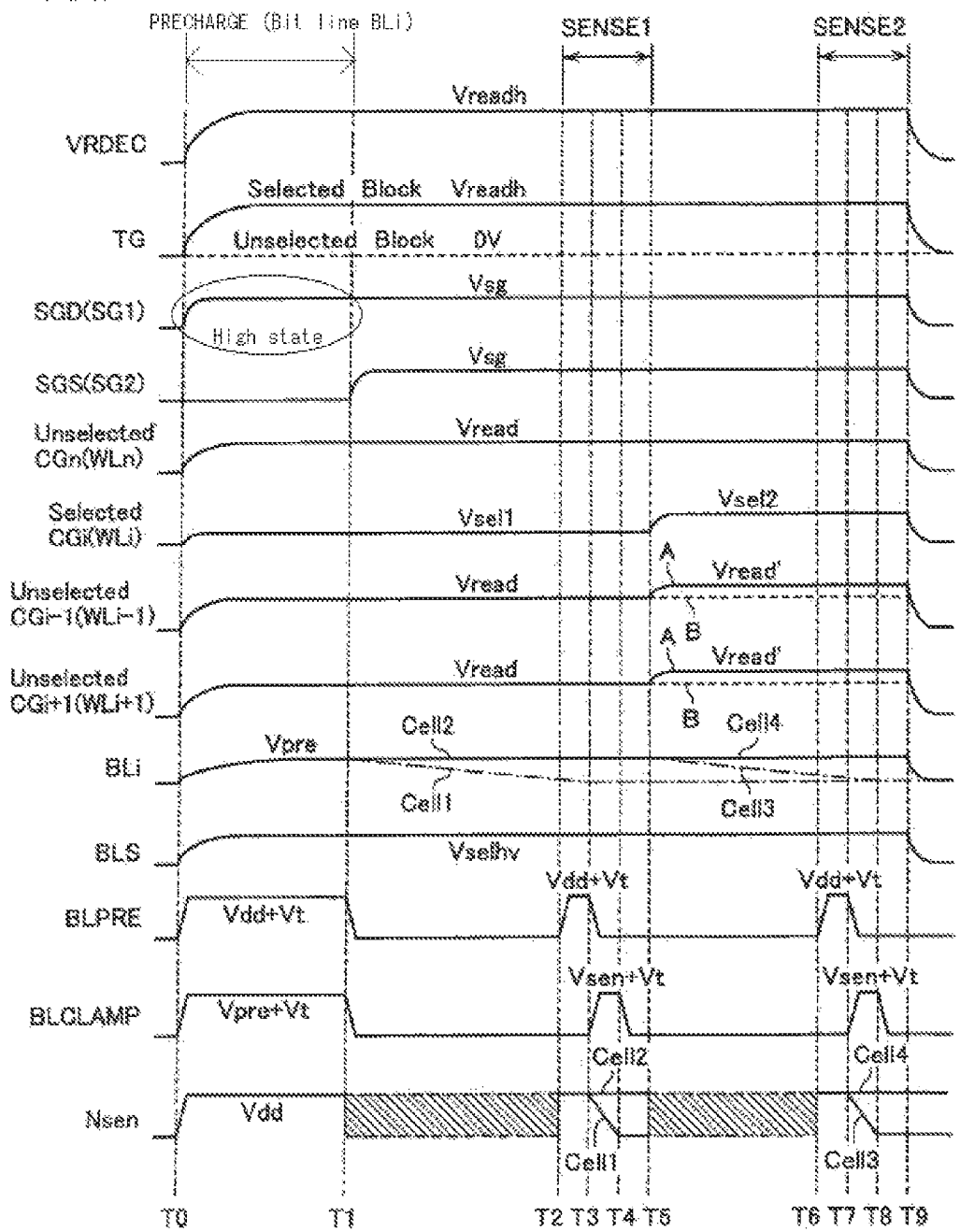
FIG. 16 is a waveform diagram illustrating a write operation of a memory system according to Modification 1 of the second embodiment.

Referring to FIG. 16 and FIG. 17, Modification 1 of the second embodiment is described.

In the Modification 1, a description is given of voltages which are applied to unselected word lines WLk−1 and WLk+1 which are adjacent to a selected word line WLk. Hereinafter, for the purpose of simple description, the unselected word lines WLk−1 and WLk+1 are referred to simply as "adjacent word lines", etc.

As illustrated in FIG. 16, at time instant T0a to time instant T7a, the control circuit 122 applies the same voltage to the unselected word line and adjacent word line. At time instant T7a to time instant T8a in FIG. 14, the control circuit 122 applies the same voltage to the unselected word line and adjacent word line. However, as illustrated in FIG. 16, in the present modification, at time instant T7a to time instant T9a, the control circuit 122 lowers the voltage, which is applied to the adjacent word line WL, from voltage "VPASS" to voltage "VSS".

With a decrease in size of the memory cell transistor MT, there is a concern of the effect from an adjacent memory cell transistor MT.

In the de-trap operation, when the voltage "VZZ" is being applied to the adjacent word line WL, there may be a case in which the electrons 13a trapped in the gate insulation film 13 are attracted to the potential of the adjacent word line WL. As a result, such a case may occur that the electrons 13 are not de-trapped to the well 12.

As illustrated in FIG. 17, in the present modification, at the time of the de-trap operation, the voltage "VSS" is applied to the adjacent word line WL. Thereby, it is possible to suppress attraction of the electrons 13a to the potential of the adjacent word line WL.

As a result, compared to the second embodiment, the de-trap operation can be executed more exactly.

<2-3-2> Modification 2 of the Second Embodiment

Figure 18:
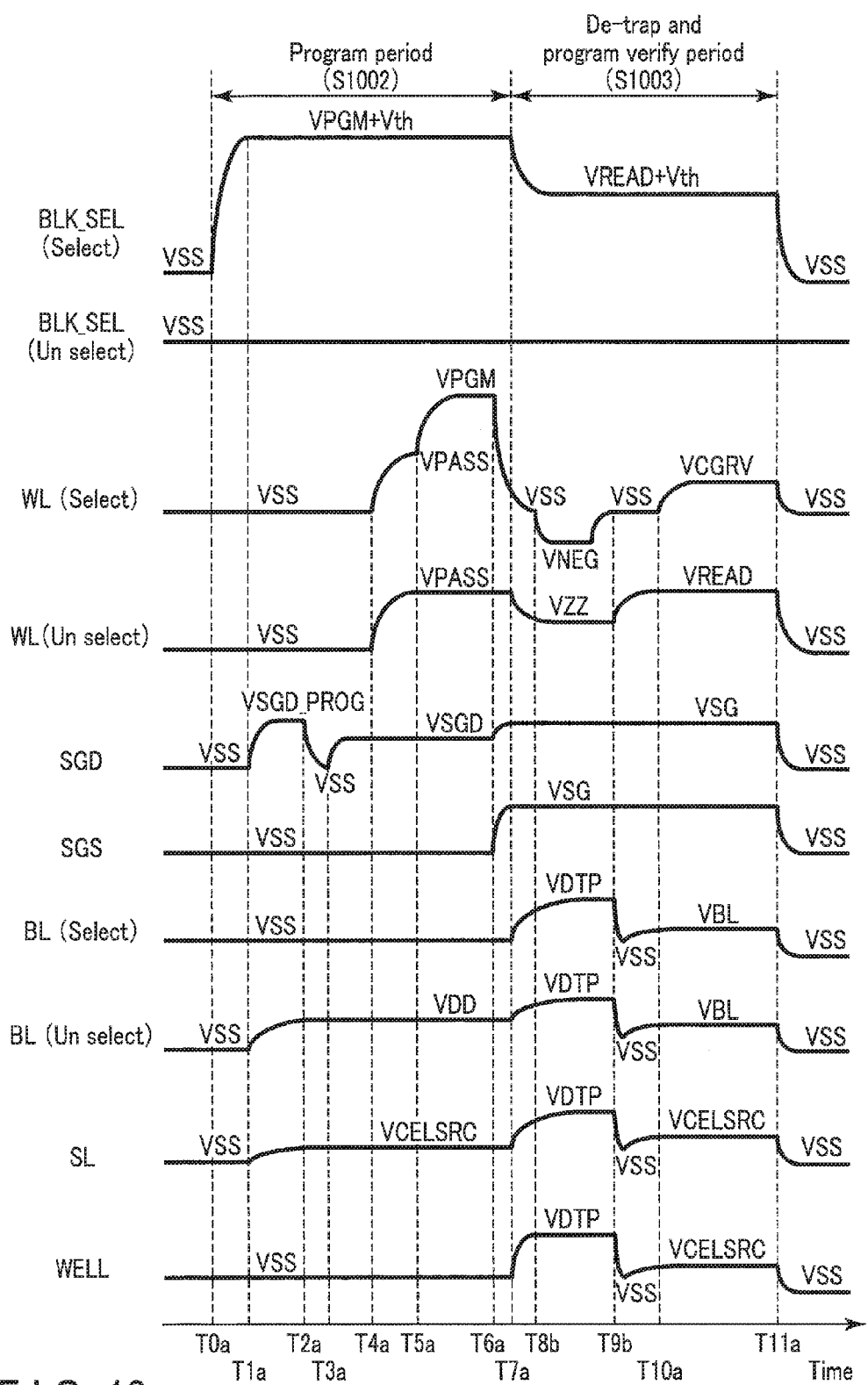
FIG. 18 is a waveform diagram illustrating a write operation of a memory system according to Modification 2 of the second embodiment.

Referring to FIG. 18, Modification 2 of the second embodiment is described.

At time instant T7a to time instant T8a in FIG. 14, the control circuit 122 applies the voltage "VSS" to the selected word line. However, as illustrated in FIG. 16, at time instant T8b to time instant T9b, in the present modification, the control circuit 122 applies voltage "VNEG" to the selected word line WL.

At time instant T8b to time instant T9b, since the negative voltage "VNEG" is applied to the selected word line WL, a greater electric field occurs between the gate insulation film 13 of the selected memory cell transistor MT and the well 12. This electric field is an electric field of an opposite polarity (opposite direction) to the electric field that is applied between the control gate electrode 16 and well 12 at a time of write. If this electric field becomes greater than the electric field in the first embodiment, the electrons 13a in the gate insulation film 13 can more easily be released (de-trapped) to the well 12.

Thereby, the electrons 13a can be de-trapped more exactly than in the first embodiment.

<2-3-3> Modification 3 of the Second Embodiment

Figure 19:
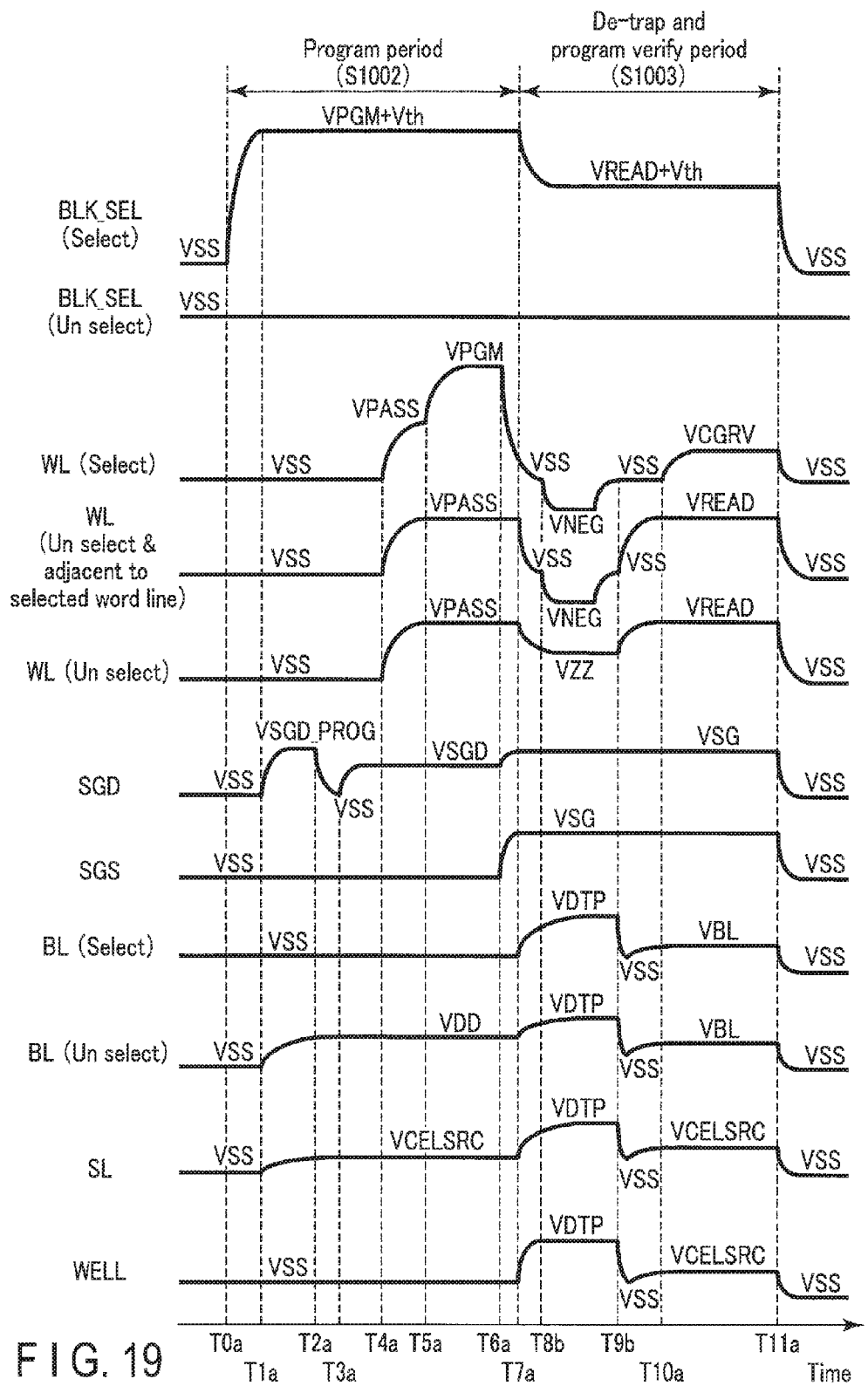
FIG. 19 is a waveform diagram illustrating a write operation of a memory system according to Modification 3 of the second embodiment.

Referring to FIG. 19, Modification 3 of the second embodiment is described.

In the present modification, at time instant T8b to time instant T9b, at the time of the de-trap operation, voltage "VNEG" is applied to the adjacent word line WL. Thereby, it is possible to suppress attraction of the electrons 13a to the potential of the adjacent word line WL.

As a result, compared to the second embodiment, the de-trap operation can be executed more exactly.

<3> Additional Descriptions

In the meantime, in the above-described embodiments and modifications, the case was described in which a planar type memory is applied as the memory cell array 130. However, even when a memory of a three-dimensional multiplayer structure is applied as the memory cell array 130, the same advantageous effects as in the above-described embodiments and modifications can be obtained.

The configuration of the memory cell array 130 is disclosed in U.S. patent application Ser. No. 12/407,403 filed 19 Mar. 2009 and entitled "three dimensional stacked nonvolatile semiconductor memory". In addition, the configuration thereof is disclosed in U.S. patent application Ser. No. 12/406,524 filed 18 Mar. 2009 and entitled "three dimensional stacked nonvolatile semiconductor memory", in U.S. patent application Ser. No. 13/816,799 filed 22 Sep. 2011 and entitled "nonvolatile semiconductor memory device", and in U.S. patent application Ser. No. 12/532,030 filed 23 Mar. 2009 and entitled "semiconductor memory and method for manufacturing the same". The entire descriptions of these patent applications are incorporated by reference herein.

In addition, Modification 1 to Modification 3 of the second embodiment may be combined with the operation described in Modification 2 of the first embodiment. Specifically, at time instant T9a to time instant T10a, the control circuit 122 may apply voltage "VCGRV" to the selected word line WL while stepping up the voltage "VCGRV". Thereby, multi-value data can be distinguished at the time of the program verify operation.

Besides, in each of the embodiments and each of the Modifications:

(1) In the read operation:

A voltage, which is applied to a word line selected in an A level read operation, is, for example, between 0 V and 0.55 V. The voltage is not limited to this, and may be between 0.1 V and 0.24 V, between 0.21 V and 0.31 V, between 0.31 V and 0.4 V, between 0.4 V and 0.5 V, or between 0.5 V and 0.55 V.

A voltage, which is applied to a word line selected in a B level read operation, is, for example, between 1.5 V and 2.3 V. The voltage is not limited to this, and may be between 1.65 V and 1.8 V, between 1.8 V and 1.95 V, between 1.95 V and 2.1 V, or between 2.1 V and 2.3 V.

A voltage, which is applied to a word line selected in a C level read operation, is, for example, between 3.0 V and 4.0 V. The voltage is not limited to this, and may be between 3.0 V and 3.2 V, between 3.2 V and 3.4 V, between 3.4 V and 3.5 V, between 3.5 V and 3.6 V, or between 3.6 V and 4.0 V.

A time (tR) of the read operation may be, for example, between 25 μs and 38 μs, between 38 μs and 70 μs, or between 70 μs and 80 μs.

(2) The write operation includes a program operation and a verify operation, as described above. In the write operation:

A voltage, which is first applied to a word line selected at a time of the program operation, is, for example, between 13.7 V and 14.3 V. The voltage is not limited to this, and may be, for example, between 13.7 V and 14.0 V, or between 14.0 V and 14.6 V.

A voltage, which is first applied to a selected word line at a time of write to an odd-numbered word line, may be made different from a voltage, which is first applied to a selected word line at a time of write to an even-numbered word line.

When an ISPP method (Incremental Step Pulse Program) is adopted for the program operation, a step-up voltage may be, for example, about 0.5 V.

A voltage, which is applied to an unselected word line, may be, for example, between 6.0 V and 7.3 V. This voltage is not limited to this case, and may be, for example, between 7.3 V and 8.4 V, or 6.0 V or less.

A pulse voltage, which is applied, may be changed according to whether an unselected word line is an odd-numbered word line or an even-numbered word line.

A time (tProg) of the write operation may be, for example, between 1700 μs and 1800 μs, between 1800 us and 1900 μs, or between 1900 μs and 2000 μs.

(3) In the erase operation:

A voltage that is first applied to a well, which is formed at an upper portion of the semiconductor substrate and on which the memory cell is disposed, is, for example, between 12 V and 13.6 V. This voltage is not limited to this case, and may be, for example, between 13.6 V and 14.8 V, between 14.8 V and 19.0 V, between 19.0 V and 19.8 V, or between 19.8 V and 21 V.

A time (tErase) of the erase operation may be, for example, between 3000 μs and 4000 μs, between 4000 μs and 5000 μs, or between 40000 μs and 9000 μs.

(4) In the configuration of memory cell:

A charge accumulation layer is disposed on a semiconductor substrate (silicon substrate) via a tunnel insulation film with a film thickness of 4 to 10 nm. This charge accumulation layer may have a multilayer structure including an insulation film of SiN or SiON with a film thickness of 2 to 3 nm, and polysilicon with a film thickness of 3 to 8 nm. In addition, a metal, such as Ru, may be added to the polysilicon. An insulation film is provided on the charge accumulation layer. This insulation film includes, for example, a silicon oxide film with a film thickness of 4 to 10 nm, which is interposed between a lower-layer High-k film with a film thickness of 3 to 10 nm and an upper-layer High-k film with a film thickness of 3 to 10 nm. The High-k film is, for instance, HfO. In addition, the film thickness of the silicon oxide film can be made greater than the film thickness of the High-k film. A control electrode with a film thickness of 30 nm to 70 nm is formed on the insulation film via a material for work function adjustment with a film thickness of 3 to 10 nm. Here, the material for work function adjustment is a metal oxide film such as TaO, or a metal nitride film such as TaN. As the control electrode, W, for instance, is usable.

In addition, an air gap can be formed between memory cells.

While certain embodiments have been described, these embodiments have been presented by way of example only, and are not intended to limit the scope of the inventions.

Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
a string unit including a plurality of memory cell transistors which are connected in series, a first select transistor connected to a first end of the plurality of memory cell transistors, and a second select transistor connected to a second end of the plurality of memory cell transistors; and
a bit line connected to the first select transistor, wherein:
the memory device is configured to execute a program on a selected memory cell transistor of the string unit, and to verify a result of the program, and
the memory device is configured to cause, at a time of verifying the result, while charging the bit line, a voltage of a control gate electrode of the selected memory cell transistor to transition to a low state, and to cause a voltage of a control gate electrode of an unselected memory cell transistor to transition from a low state to a high state, after setting the first select transistor and the second select transistor to an OFF state.

2. The memory device according to claim 1, wherein the memory device is configured to apply, while charging the bit line, a first voltage to control gate electrodes of the first select transistor and the second select transistor and the control gate electrode of the selected memory cell transistor, and to apply a second voltage, which is higher than the first voltage, to the control gate electrode of the unselected memory cell transistor.

3. The memory device according to claim 1, wherein the memory device is configured to apply, while charging the bit line, a first voltage to the control gate electrode of the selected memory cell transistor, to apply a third voltage, which is higher than the first voltage, to control gate electrodes of the first select transistor and the second select transistor, and to apply a second voltage, which is higher than the first voltage and the third voltage, to the control gate electrode of the unselected memory cell transistor.

4. The memory device according to claim 1, wherein the memory device is configured to apply, while charging the bit line, a first voltage to control gate electrodes of the first select transistor and the second select transistor, to apply a fourth voltage, which is higher than the first voltage, to the control gate electrode of the selected memory cell transistor and then apply the first voltage to the control gate electrode of the selected memory cell transistor, and to apply a second voltage, which is higher than the first voltage, to the control gate electrode of the unselected memory cell transistor.

5. The memory device according to claim 1, wherein the memory device is configured to apply, at a time of the verifying the result, upon completion of the charging of the bit line, a fifth voltage, which sets the selected memory cell transistor to an ON state or an OFF state, to the control gate electrode of the selected memory cell transistor.

6. The memory device according to claim 1, wherein:
the string unit is provided on a semiconductor substrate, and
the memory device is configured to apply, at a time of the verifying the result, while charging the bit line, a positive voltage to the semiconductor substrate and a cell source.

7. The memory device according to claim 6, wherein the memory device is configured to apply, at the time of the verifying the result, upon completion of the charging of the bit line, a fifth voltage, which sets the selected memory cell transistor to an ON state or an OFF state, to the control gate electrode of the selected memory cell transistor, and to execute negative sense on the selected memory cell transistor.

8. The memory device according to claim 1, wherein the memory device is configured to apply, at a time of the verifying the result, while charging the bit line, a negative voltage to the control gate electrode of the selected memory cell transistor.

9. A memory device comprising a block, the block including:
a string unit provided on a semiconductor substrate and configured such that a plurality of memory cell transistors are connected in series;
a first select transistor provided on the semiconductor substrate and connected to a first end of the string unit;
a second select transistor provided on the semiconductor substrate and connected to a second end of the string unit;
a bit line connected to the first select transistor; and
a word line connected to a gate of the memory cell transistor,
wherein the memory device is configured:
to execute a program on a selected memory cell transistor of the string unit, and
to cause, in an operation transitioning to program verification while keeping a state in which voltages can be applied to the bit line, the word line, gates of the first and second select transistors of the block, and the selected memory cell transistor to transition to a low voltage state, to cause an unselected memory cell transistor to transition to a high voltage state, and to apply a positive voltage to the semiconductor substrate in a background in which a logic process of the program verification is being prepared.

10. The memory device according to claim 9, wherein the memory device is configured to cause, at a time of the program verification, an unselected memory cell transistor adjacent to the selected memory cell transistor to transition to a high voltage state.

11. The memory device according to claim 9, wherein the memory device is configured to apply, at a time of the program verification, while charging the semiconductor substrate with a positive voltage, a negative voltage to a control gate electrode of the selected memory cell transistor.

12. The memory device according to claim 11, wherein the memory device is configured to apply, at a time of the program verification, while charging the semiconductor substrate with a positive voltage, a negative voltage to a control gate electrode of an unselected memory cell transistor adjacent to the selected memory cell transistor.

13. A method for controlling a memory device, comprising:
executing a program on a selected memory cell transistor of a string unit in which a plurality of memory cell transistors are connected in series; and
executing verification on a result of the program, wherein:

a first select transistor is connected to a first end of the string unit, a second select transistor is connected to a second end of the string unit, a bit line is connected to the first select transistor, and the method further comprises causing, at a time of the verification, while charging the bit line, a voltage of a control gate electrode of the selected memory cell transistor to transition to a low state, and causing a voltage of a control gate electrode of an unselected memory cell transistor to transition from a low state to a high state, after setting the first select transistor and the second select transistor to an OFF state.

14. The method according to claim 13, further comprising applying, while charging the bit line, a first voltage to control gate electrodes of the first select transistor and the second select transistor and the control gate electrode of the selected memory cell transistor, and applying a second voltage, which is higher than the first voltage, to the control gate electrode of the unselected memory cell transistor.

15. The method according to claim 13, further comprising applying, while charging the bit line, a first voltage to the control gate electrode of the selected memory cell transistor, to apply a third voltage, which is higher than the first voltage, to control gate electrodes of the first select transistor and the second select transistor, and applying a second voltage, which is higher than the first voltage and the third voltage, to the control gate electrode of the unselected memory cell transistor.

16. The method according to claim 13, further comprising applying, while charging the bit line, a first voltage to control gate electrodes of the first select transistor and the second select transistor, applying a fourth voltage, which is higher than the first voltage, to the control gate electrode of the selected memory cell transistor and then apply the first voltage to the control gate electrode of the selected memory cell transistor, and applying a second voltage, which is higher than the first voltage, to the control gate electrode of the unselected memory cell transistor.

17. The method according to claim 13, further comprising applying, at a time of the verification, upon completion of the charging of the bit line, a fifth voltage, which sets the selected memory cell transistor to an ON state or an OFF state, to the control gate electrode of the selected memory cell transistor.

18. The method according to claim 13, wherein:

the string unit is provided on a semiconductor substrate, and the method further comprises applying, at a time of the verification, a positive voltage to the semiconductor substrate while charging the bit line.

19. The method according to claim 18, further comprising applying, at the time of the verification, upon completion of the charging of the bit line, a fifth voltage, which sets the selected memory cell transistor to an ON state or an OFF state, to the control gate electrode of the selected memory cell transistor, and executing negative sense on the selected memory cell transistor.

20. The method according to claim 13, further comprising applying, at a time of the verification, while charging the bit line, a negative voltage to the control gate electrode of the selected memory cell transistor.

* * * * *